(12) United States Patent
Bowles et al.

(10) Patent No.: US 8,563,213 B2
(45) Date of Patent: Oct. 22, 2013

(54) METHODS FOR PRODUCING PHOTOSENSITIVE MICROPARTICLES

(75) Inventors: Steven E. Bowles, Pittsburgh, PA (US); Anu Chopra, Pittsburgh, PA (US); Randy E. Daughenbaugh, Monroeville, PA (US); Dennis L. Faler, North Huntingdon, PA (US); M. Frank Haley, Glenshaw, PA (US); Paul H. Lamers, Allison Park, PA (US); Yunyi Lu, Monroeville, PA (US); Kevin J. Stewart, Murrysville, PA (US); Cathy A. Taylor, Allison Park, PA (US); Feng Wang, Export, PA (US); Elizabeth A. Zezinka, Cranberry Township, Butler County, PA (US)

(73) Assignee: Transitions Optical, Inc., Pinellas Park, FL (US)

( * ) Notice: Subject to any disclaimer, the term of this patent is extended or adjusted under 35 U.S.C. 154(b) by 354 days.

(21) Appl. No.: 12/719,335

(22) Filed: Mar. 8, 2010

(65) Prior Publication Data

US 2010/0221661 A1     Sep. 2, 2010

Related U.S. Application Data

(63) Continuation-in-part of application No. 10/892,919, filed on Jul. 16, 2004, now Pat. No. 8,153,344.

(51) Int. Cl.
*G03C 1/72* (2006.01)
*G03F 7/00* (2006.01)

(52) U.S. Cl.
CPC ..................................... *G03F 7/002* (2013.01)
USPC ..................................... 430/138; 430/270.1

(58) Field of Classification Search
CPC .................. G03C 1/72; G03F 7/002
USPC .................. 430/138, 270.1; 525/452
See application file for complete search history.

(56) References Cited

U.S. PATENT DOCUMENTS

| | | | |
|---|---|---|---|
| 108,935 A | 11/1870 | Rich | |
| 108,936 A | 11/1870 | Rich | |
| 4,046,729 A | 9/1977 | Scriven et al. | |
| 4,358,388 A | 11/1982 | Daniel et al. | |
| 4,533,254 A | 8/1985 | Cook et al. | |
| 4,546,045 A | 10/1985 | Elias | |
| 4,556,605 A | 12/1985 | Mogami et al. | |
| 4,681,811 A | 7/1987 | Simpson et al. | |
| 4,685,783 A | 8/1987 | Heller et al. | |
| 4,732,790 A | 3/1988 | Blackburn et al. | |
| 4,740,055 A * | 4/1988 | Kanda et al. ................. | 385/141 |
| 4,798,746 A | 1/1989 | Claar et al. | |
| 4,929,693 A | 5/1990 | Akashi et al. | |
| 4,931,220 A | 6/1990 | Haynes et al. | |
| 4,963,461 A | 10/1990 | Takahashi et al. | |
| 5,061,602 A | 10/1991 | Koch et al. | |
| 5,071,904 A | 12/1991 | Martin et al. | |
| 5,134,053 A | 7/1992 | Mueller-hess et al. | |
| 5,143,997 A | 9/1992 | Endo et al. | |
| 5,166,345 A * | 11/1992 | Akashi et al. ................. | 544/71 |
| 5,246,748 A | 9/1993 | Gillberg-Laforce et al. | |
| 5,252,450 A | 10/1993 | Schwerzel et al. | |
| 5,356,713 A | 10/1994 | Charmot et al. | |
| 5,393,637 A * | 2/1995 | Kanda et al. ................. | 430/138 |
| 5,458,814 A | 10/1995 | Kumar et al. | |
| 5,468,802 A | 11/1995 | Wilt et al. | |
| 5,527,879 A | 6/1996 | Nakae et al. | |
| 5,631,382 A | 5/1997 | Tanizawa et al. | |
| 5,639,802 A | 6/1997 | Neckers et al. | |
| 5,645,767 A | 7/1997 | Van Gemert | |
| 5,658,501 A | 8/1997 | Kumar et al. | |
| 5,698,141 A | 12/1997 | Kumar | |
| 5,723,072 A | 3/1998 | Kumar | |
| 5,919,846 A | 7/1999 | Batlaw et al. | |
| 5,952,131 A | 9/1999 | Kumacheva et al. | |
| 6,022,497 A | 2/2000 | Kumar | |

(Continued)

FOREIGN PATENT DOCUMENTS

| | | |
|---|---|---|
| EP | 0277639 A2 | 2/1988 |
| JP | 64-29489 | 1/1989 |

(Continued)

OTHER PUBLICATIONS

"Catalysts and Additives (Polyurethanes)," *Ullman's Encyclopedia of Industrial Chemistry*, Completely Revised Fifth Edition, vol. A21, pp. 673-674, Section 3.5 (1992).

(Continued)

*Primary Examiner* — John Chu
(74) *Attorney, Agent, or Firm* — Deborah M Altman

(57) ABSTRACT

Described are various methods of producing non-aqueous dispersions of photosensitive polymeric microparticles, comprising: (a) preparing one or more aqueous dispersions of a polymerizable component, at least one of which contains a photosensitive material and, wherein the polymerizable components comprise at least one hydrophilic functional group and/or at least one hydrophobic functional group; (b) subjecting the dispersion of (a) to conditions sufficient to form microparticles; (c) at least partially polymerizing the polymerizable component; (d) combining the dispersion with an organic continuous phase comprising an organic solvent; (e) removing water from the dispersion such that the final water content of the non-aqueous dispersion is less than 30 percent by weight; wherein e) is performed before or after d); and (f) reacting any acid functional groups on the surface of the microparticles with a reactive material having at least one epoxy functional group, at least one thiocarbonylthio functional group, at least one alkoxyamine functional group, or at least one halide functional group.

22 Claims, No Drawings

(56) References Cited

U.S. PATENT DOCUMENTS

| | | |
|---|---|---|
| 6,025,026 A | 2/2000 | Smith et al. |
| 6,060,001 A | 5/2000 | Welch et al. |
| 6,080,338 A | 6/2000 | Kumar |
| 6,113,814 A | 9/2000 | Van Gemert et al. |
| 6,136,968 A | 10/2000 | Chamontin et al. |
| 6,150,430 A | 11/2000 | Walters et al. |
| 6,153,126 A | 11/2000 | Kumar |
| 6,180,181 B1 | 1/2001 | Verardi et al. |
| 6,187,444 B1 | 2/2001 | Bowles, III et al. |
| 6,210,854 B1 * | 4/2001 | Grossman et al. ............ 430/138 |
| 6,214,500 B1 * | 4/2001 | Kumacheva et al. ........... 430/21 |
| 6,268,055 B1 | 7/2001 | Walters et al. |
| 6,281,272 B1 | 8/2001 | Baldy et al. |
| 6,291,564 B1 | 9/2001 | Faler et al. |
| 6,296,785 B1 | 10/2001 | Nelson et al. |
| 6,325,957 B1 | 12/2001 | Kumacheva et al. |
| 6,329,060 B1 | 12/2001 | Barkac et al. |
| 6,337,131 B1 | 1/2002 | Rupaner et al. |
| 6,338,808 B1 | 1/2002 | Kawata et al. |
| 6,348,604 B1 | 2/2002 | Nelson et al. |
| 6,353,102 B1 | 3/2002 | Kumar |
| 6,432,544 B1 | 8/2002 | Stewart et al. |
| 6,433,043 B1 | 8/2002 | Misura et al. |
| 6,436,525 B1 | 8/2002 | Welch et al. |
| 6,506,488 B1 | 1/2003 | Stewart et al. |
| 6,525,136 B1 | 2/2003 | Foucher et al. |
| 6,531,076 B2 | 3/2003 | Crano et al. |
| 6,555,028 B2 | 4/2003 | Walters et al. |
| 6,599,973 B1 | 7/2003 | Visscher et al. |
| 6,602,603 B2 | 8/2003 | Welch et al. |
| 6,607,994 B2 | 8/2003 | Soane et al. |
| 6,630,597 B1 | 10/2003 | Lin et al. |
| 6,641,874 B2 | 11/2003 | Kuntz et al. |
| 6,645,767 B1 | 11/2003 | Villa et al. |
| 6,687,266 B1 | 2/2004 | Ma et al. |
| 6,713,536 B2 | 3/2004 | Misura et al. |
| 6,733,887 B2 | 5/2004 | Okoroafor et al. |
| 6,749,779 B2 | 6/2004 | Soane et al. |
| 6,770,710 B2 | 8/2004 | Robert et al. |
| 6,875,483 B2 | 4/2005 | Ichihashi et al. |
| 6,998,072 B2 | 2/2006 | Welch et al. |
| 7,097,303 B2 | 8/2006 | Kumar et al. |
| 7,186,359 B2 | 3/2007 | Maisonnier et al. |
| 7,256,921 B2 | 8/2007 | Kumar et al. |
| 7,342,112 B2 | 3/2008 | Kumar et al. |
| 7,438,972 B2 | 10/2008 | Faler et al. |
| 7,452,611 B2 | 11/2008 | Blackburn et al. |
| 7,632,540 B2 | 12/2009 | Kumar et al. |
| 2003/0086978 A1 | 5/2003 | Kim et al. |
| 2003/0141490 A1 | 7/2003 | Walters et al. |
| 2003/0174560 A1 | 9/2003 | Dahmen et al. |
| 2005/0196626 A1 | 9/2005 | Knox et al. |
| 2005/0287354 A1 | 12/2005 | Jennings et al. |
| 2006/0014099 A1 | 1/2006 | Faler et al. |
| 2008/0026217 A1 | 1/2008 | Kim et al. |

FOREIGN PATENT DOCUMENTS

| | | |
|---|---|---|
| JP | 1992-117483 | 4/1992 |
| JP | 1994-256758 | 9/1994 |
| JP | 7-26027 | 1/1995 |
| JP | 7-62337 | 3/1995 |
| RU | 2095836 C1 | 10/1997 |
| WO | WO 98/37115 | 8/1998 |
| WO | WO 01/57106 A1 | 8/2001 |
| WO | WO 02/04535 A1 | 1/2002 |
| WO | WO 02/057070 A2 | 7/2002 |
| WO | WO 03/008009 A1 | 1/2003 |
| WO | 03038009 A1 | 5/2003 |
| WO | WO 03/077033 A2 | 9/2003 |

OTHER PUBLICATIONS

Haugland, R.P., *Molecular Probes Handbook for Fluorescent Probes and Research Chemicals*, Sixth Edition, 1996.

D. Arivuoli "Fundamentals of Nonlinear Optical Materials" PRAMANA—Journal of Physics vol. 57, Nos. 5&6, Nov. & Dec. 2001, pp. 871-883.

Nalwa, H.S. and Miyata S. Editors, *Nonlinear Optics of Organic Molecules and Polymers* by CRC Press 1997.

"Chromogenic Materials (Inorganic Photochromic)", *Kirk Othmer Encyclopedia of Chemcial Technology*, Fourth Edition, vol. 6, pp. 322-325.

"Photochromism", *Techniques of Chemistry*, vol. III, Glenn H. Brown, Editor, John Wiley and Sons, Inc., New York (1971).

"Electrically Conductive Polymers," *Kirk Othmer Encyclopedia of Chemical Technology*, Fourth Edition, vol. 9, pp. 61-88.

"Redox Polymerization" by G.S. Misra, *Prog. Polym. Sci.* vol. 8, pp. 61-131 (1982).

"Preparation and optical properties of polystyrene nanocapsules containing photochromophores" by Mijeong Han et al., PITCAL Materials, Korea Research Institute of Chemical Technology, pp. 579-583 (2002).

"Nano-Encapsulation of Photochromic Compounds Using Diblock Copolymers" by Young J. Kim et al., Polymer Preprints, pp. 1226-1227 (2002).

"Synthesis and Polymerization of Amphiphilic Methacrylates Containing Permanent Dipole Azobenzene Chromophores" by Angelina Altomare et al., Journal of Polymer Science: Part A: Polymer Chemistry, vol. 39, pp. 22957-22977, John Wiley & Sons, Inc. (2001).

Methacrylic polymers containing permanent dipole azobenzene chromophores spaced from the main chain. $^{13}$CNMR spectra and photochromic properties[a], Angelina Altomare, et al., University of Piza, Department of Chemistry, Marcromol. Chem. Phys. 200, No. 3, pp. 601-608 (1998).

"Methacrylic Polymers Conaining Permanent Dipole Azobenzene Chromophores Spaced from the Main Chain Synthesis and Characterization", Angelina Altomare, et al., Polymer International 47 pp. 419-427 (1998)

"Halographic Gratings in Azobenzene Side-Chain Polymethacrylates", Luisa Andruzzi, et al., American Chemical Society, Marcomolecules, pp. 448-454 (1999).

U.S. Appl. No. 10/876,031, filed Jun. 24, 2004; Aqueous Dispersions of Microparticles Having A Nanoparticulate Phase and Coating Compositions Containing the Same.

* cited by examiner

# METHODS FOR PRODUCING PHOTOSENSITIVE MICROPARTICLES

CROSS-REFERENCE TO RELATED APPLICATIONS

This application is a continuation-in-part of U.S. patent application Ser. No. 10/892,919, filed on Jul. 16, 2004 which is incorporated herein by reference in its entirety.

BACKGROUND OF THE INVENTION

The present invention is directed to methods of producing non-aqueous dispersions of photosensitive polymeric microparticles.

Photosensitive materials demonstrate a response to electromagnetic radiation, including infrared, visible and ultraviolet radiation as well as light amplification by stimulated emission or laser. This response can be a type of luminescence in which visible radiation is emitted by a photosensitive material after exposure, e.g., fluorescent and phosphorescent materials; in which there is a change in the wavelength of the electromagnetic radiation passing through the material, e.g., non-linear optical materials; or in which there is a reversible change in color, e.g., photochromic materials.

Aqueous dispersions of photosensitive microparticles, and waterborne film-forming compositions containing them, can demonstrate several disadvantages. For example, waterborne film-forming compositions tend to generate foam during formulation, far more so than solventborne compositions. Foaming can make application difficult. Expensive humidity controls are often needed for application of waterborne film-forming compositions, since relative humidity can affect flow properties and drying rates of a coating. Choices for adjuvant organic solvents can be limited in waterborne compositions because of evaporation rates and poor compatibility with the aqueous medium. Also, the high surface tension of water can result in difficult wetting of certain substrates. Production equipment which contacts waterborne compositions need to be corrosion resistant. This usually involves using plastic or expensive stainless steel in the production environment. Waterborne compositions also can be difficult to render acid free due to the stabilization mechanism of acid in water. The use of materials comprised of water-sensitive functional groups, such as epoxy groups, can be problematic in waterborne coatings because appearance problems such as blushing in humid environments can develop. Microorganism growth also can be a problem in waterborne compositions.

There are known products that utilize photosensitive materials, e.g., optical elements such as optical memory elements and display elements. Although products incorporating core/shell microparticles that demonstrate photosensitive properties are known, it is desirable to provide non-aqueous products in which the properties of the photosensitive materials in the microparticles can be controlled, thereby avoiding the drawbacks of waterborne compositions. It is also desirable to control product properties such as hardness or abrasion resistance, without adversely affecting the properties of the photosensitive materials which comprise the products.

SUMMARY OF THE INVENTION

The present invention is drawn to methods for producing a non-aqueous dispersion of photosensitive microparticles. An exemplary method comprises:
a) preparing an aqueous dispersion of a photosensitive material and a polymerizable component, wherein the polymerizable component comprises at least one hydrophilic functional group and at least one hydrophobic functional group;
b) subjecting the dispersion of a) to conditions sufficient to form microparticles;
c) at least partially polymerizing the polymerizable component;
d) combining the dispersion with an organic continuous phase comprising an organic solvent;
e) removing water from the dispersion such that the final water content of the non-aqueous dispersion is less than 30 percent by weight; wherein e) is performed before or after d); and
f) reacting any acid functional groups in the microparticles with at least one reactive material such as a material having at least one epoxy functional group, at least one thiocarbonylthio functional group, at least one alkoxyamine functional group, or at least one halide functional group. The present invention also is directed to, a method for producing a non-aqueous dispersion of photosensitive microparticles, comprising:
a) preparing an aqueous dispersion of a substantially hydrophilic prepolymer component;
b) preparing an aqueous dispersion of a substantially hydrophobic prepolymer component, wherein the dispersion of a) and/or b) further comprises a photosensitive material;
c) combining the dispersions of a) and b) to form a mixture and subjecting the mixture to conditions sufficient to form microparticles;
d) polymerizing the prepolymer components in the mixture;
e) combining the mixture with an organic continuous phase comprising an organic solvent;
f) removing water from the mixture such that the final water content less than 30 percent by weight; wherein f) is performed before or after e); and
g) reacting any acid functional groups in the microparticles with at least one reactive material, such as a material having at least one epoxy functional group, and at least one hydroxyl functional group, at least one thiocarbonylthio functional group, at least one alkoxyamine functional group, or at least one halide functional group.

DETAILED DESCRIPTION OF THE INVENTION

As used in this specification and the appended claims, the singular forms "a," "an," and "the" include plural referents unless expressly and unequivocally limited to one referent.

For the purposes of this specification, unless otherwise indicated, all numbers expressing quantities of ingredients, reaction conditions, and other parameters used in the specification and claims are to be understood as being modified in all instances by the term "about". Accordingly, unless indicated to the contrary, the numerical parameters set forth in the following specification and attached claims are approximations that may vary depending upon the desired properties sought to be obtained by the present invention. At the very least, and not as an attempt to limit the application of the doctrine of equivalents to the scope of the claims, each numerical parameter should at least be construed in light of the number of reported significant digits and by applying ordinary rounding techniques.

All numerical ranges herein include all numerical values and ranges of all numerical values within the recited range of numerical values. Notwithstanding that the numerical ranges and parameters setting forth the broad scope of the invention are approximations, the numerical values set forth in the specific examples are reported as precisely as possible. Any numerical value, however, inherently contain certain errors` necessarily resulting from the standard deviation found in their respective testing measurements.

The various embodiments and examples of the present invention as presented herein are each understood to be non-limiting with respect to the scope of the invention.

The term "monomer" includes single monomer units and oligomers that comprise a few monomer units.

The term "actinic radiation" includes light with wavelengths of electromagnetic radiation ranging from the ultraviolet ("UV") light range, through the visible light range, and into the infrared range. Actinic radiation which can be used to cure coating compositions used in the present invention generally has wavelengths of electromagnetic radiation ranging from 150 to 2,000 nanometers (nm), from 180 to 1,000 nm, or from 200 to 500 nm. For example, ultraviolet radiation having a wavelength ranging from 10 to 390 nm can be used. Examples of suitable ultraviolet light sources include mercury arcs, carbon arcs, low, medium or high pressure mercury lamps, swirl-flow plasma arcs and ultraviolet light emitting diodes. Suitable ultraviolet light-emitting lamps are medium pressure mercury vapor lamps having outputs ranging from 200 to 600 watts per inch (79 to 237 watts per centimeter) across the length of the lamp tube.

In accordance with the present invention, methods for producing a non-aqueous dispersion of photosensitive polymeric microparticles are provided. The non-aqueous dispersion comprises: a) an organic continuous phase comprising an organic solvent; and b) photosensitive polymeric microparticles dispersed in the organic continuous phase, wherein the microparticles comprise an at least partially polymerized component having integral surface and interior domains, wherein the surface domain comprises a polymeric material that is solubilized by the organic solvent, the interior domain comprises a polymeric material that is insoluble in the organic solvent, and the surface domain and/or interior domain is photosensitive.

The organic solvent in the organic continuous phase is typically a polar solvent and may comprise, for example, one or more alcohols, such as monoalcohols or diols, including glycols, ethers, amides, nitriles, esters, ketones, and/or lactams. Polar solvents, by definition, have molecules whose electric charges are unequally distributed, leaving one end of each molecule more positive than the other, such that solutes dissolved therein are prone to form ions. Especially suitable solvents include n-butanol, isobutanol, isopropanol, benzyl alcohol, ethylene glycol, diethylene glycol, propylene glycol, tetrahydrofurfuryl alcohol, propylene glycol monobutyl ether, ethylene glycol monohexyl ether, ethylene glycol monobutyl ether, diethylene glycol butyl ether, ethylene glycol monomethyl ether, propylene glycol monomethyl ether, dimethylformamide, N-methylpyrrolidone, methyl ethyl ketone, methyl amyl ketone, TEXANOL® solvent, which is reported to be 2,2,4-trimethyl-1,1,3-pentanediol monoisobutyrate and which is available from Eastman Chemical Co., and mixtures of such solvents. The use of organic solvents can aid in the process of forming the polymeric microparticles.

Photosensitive polymeric microparticles are dispersed in the organic continuous phase. The microparticles comprise an at least partially polymerized component having integral surface and interior domains. Either or both of the surface domain and interior domain may be photosensitive. The surface domain comprises a polymeric material that is solubilized by the organic solvent and the interior domain comprises a polymeric material that is insoluble in the organic solvent. The photosensitive microparticles typically comprise at least partially crosslinked microparticles.

The non-aqueous dispersions may be prepared in any of various ways in accordance with the present invention, as noted above. For example, a non-aqueous dispersion of photosensitive microparticles may be prepared as follows:

a) preparing an aqueous dispersion of a photosensitive material and a polymerizable component, wherein the polymerizable component comprises at least one hydrophilic functional group and at least one hydrophobic functional group;

b) subjecting the dispersion of a) to conditions sufficient to form microparticles, such as high shear stress conditions;

c) at least partially polymerizing the polymerizable component;

d) combining the dispersion with an organic continuous phase comprising an organic solvent, typically a polar solvent;

e) removing water from the dispersion such that the final water content of the non-aqueous dispersion is less than 30 percent by weight; and f) reacting any acid functional groups in the microparticles with at least one reactive material such as a material having at least one epoxy functional group, at least one hydroxyl functional group, at least one thiocarbonylthio functional group, at least one alkoxyamine functional group, or at least one halide functional group. Note that e) may be performed before or after d).

The non-aqueous dispersions of the present invention can comprise an amount of water that is less than 30 weight percent.

The polymerizable component in the aqueous dispersion prepared in a) may comprise at least one substantially hydrophilic monomer and at least one substantially hydrophobic monomer, the hydrophilic monomer and the hydrophobic monomer being capable of at least partially forming microparticles of the polymerizable component with which the photosensitive material, such as a photochromic material, is associated. Alternatively, the aqueous dispersion may comprise an effective amount of at least one photosensitive material and at least one polymerizable component comprising at least one hydrophilic functional group and at least one hydrophobic functional group, the photosensitive material(s) and polymerizable component(s) being capable of forming at least partially crosslinked photosensitive polymeric microparticles. The polymerizable component may also comprise at least one substantially hydrophilic prepolymer, at least one substantially hydrophobic prepolymer, and an effective amount of at least one organic photochromic material comprising at least one polymerizable group, the polymerizable component being capable of forming photochromic polymeric microparticles. The photochromic polymeric microparticles typically comprise at least partially crosslinked polymeric microparticles.

The polymerizable component can still further comprise a material that is copolymerizable with at least one of the substantially hydrophilic and substantially hydrophobic monomers, which material is hereinafter referred to as the "copolymerizable material". Moreover, the polymerizable component can possess functionality capable of reacting with crosslinking materials, to be compatible with host materials and to have properties associated with the photosensitive polymeric microparticles described hereinafter.

The phrase "being capable of at least partially forming microparticles of the polymerizable component with which the photosensitive material is associated" refers to the polymerizable component being suitable to self assemble into at least partially formed microparticles. Self-assembly of the microparticles is due to the difference in the hydrophilicity and hydrophobicity associated with the hydrophilic functional group(s) of the substantially hydrophilic monomer and the hydrophobic functional group(s) of the substantially hydrophobic monomer comprising the polymerizable component. The photosensitive material can be associated with the microparticles by the selection of hydrophilic photosensitive material(s), hydrophobic photosensitive material(s) and/or photosensitive material having another property that allows it to chemically or physically associate with the resulting microparticles or the polymerizable component.

After formation of the microparticles, they are typically polymerized. That is, the microparticles are at least partially polymerized and form at least partially crosslinked polymeric microparticles wherein at least a portion of the monomers or prepolymers in the polymerizable component react and combine to form chain-like polymeric materials. The reactive groups on at least a portion of these chain-like polymeric materials react and crosslink to form polymeric networks in which at least a portion of some to all of the chains are interconnected. The aforementioned reactive groups are chemical groups capable of undergoing a polymerization reaction known to those skilled in the art. Examples of such polymerizable groups include but are not limited to methacryloyloxy, acryloyloxy, vinyl, allyl, carboxyl, amino, mercapto, epoxy, hydroxy and isocyanato The polymerized microparticles formed in b) and c) have a core/shell structure that enables them to be especially useful for preparing the non-aqueous dispersions of the present invention, in particular, polar non-aqueous dispersions. The core (interior domain) and shell (surface domain) polymers are covalently attached to each other. Otherwise, the compatibility of the shell polymer with the solvent in the organic continuous phase would cause the shell to dissolve away from the core material. Also, the core is crosslinked and/or consists of a material that is inherently insoluble in the organic continuous phase and the shell consists of a polymer that, if it were not attached to the insoluble core, would be completely soluble in the organic continuous phase. The solubility of the shell polymer makes the core/shell microparticle compatible with the solvent and the insolubility of the core maintains the integrity of the microparticle by preventing the microparticle from completely dissolving in the solvent.

When combining the dispersion with the organic continuous phase in d), the dispersion may be poured into the organic continuous phase or vice versa. Water is removed from the dispersion using known methods, such as by ultrafiltration, distillation under reduced pressure or by centrifuge.

In (f) of the method, any acid functional groups in the microparticles are reacted with a reactive material having at least one epoxy functional group. Any epoxy functional reactive material may be used, provided it does not detrimentally affect properties, such as stability or compatibility, of the non-aqueous dispersion or compositions in which the non-aqueous dispersion is used. Within the scope of this invention, the term "epoxy compound" represents epoxy compounds containing one glycidyl, b-methylglycidyl or cycloalkylene oxide functionality. Non-limiting examples of glycidyl ether compounds are methyl glycidyl ether, n-butyl glycidyl ether, iso-butyl glycidyl ether, phenyl glycidyl ether, allyl glycidyl ether, 3-(trimethoxysilyl)propyl glycidyl ether and 2,3-epoxy-1-propanol. Non-limiting examples of glycidyl esters include glycidyl hexanoate, glycidyl(meth)acrylate and Cardura™ E10P, the glycidyl ester of Versatic™ acid 10. Non-limiting examples of cycloalkylene oxide compounds are 3-vinyl-7-oxabicyclo[4.1.0]heptane [106-86-5], allyl 4-methyl-7-oxabicyclo[4.1.0]heptane-3-carboxylate [10138-39-3], 2-ethylhexyl 7-oxabicyclo[4.1.0]heptane-3-carboxylate [62256-00-2] and 2-(7-oxabicyclo[4.1.0]hept-3-yl)ethyl-trimethoxysilane [3388-04-3].

In certain embodiments of the present invention, the reactive material has at least one epoxy functional group and at least one hydroxyl functional group, at least one thiocarbonylthio functional group, at least one alkoxyamine functional group, or at least one halide functional group. Among reactive materials having at least one epoxy functional group and at least one hydroxyl functional group, 2,3-epoxy-1-propanol (glycidol) is most often used.

Coating compositions that are formulated using non-aqueous dispersions prepared from this method have demonstrated increased shelf life, as well as improved water resistance after application to a substrate and curing.

In certain aspects of the present invention, the reactive material used in (f) has at least one epoxy functional group and at least one halide functional group. These reactive materials have been used as initiators in living polymerization processes described below. Such reactive materials may be prepared as a reaction product of (1) an epoxy functional compound with at least one active hydrogen group capable of reacting with an acid halide or alkyl ester and (2) an acid halide or alkyl ester functional compound having at least one halide functional group. For example, the reactive material may comprise a reaction product of (1) 2,3-epoxy-1-propanol (glycidol) and (2) 2-bromo-2-methylpropanoyl bromide.

International patent publication WO 97/18247 and U.S. Pat. Nos. 5,763,548 and 5,789,487 describe a radical polymerization process referred to as atom transfer radical polymerization (ATRP). The ATRP process is described as being a living radical polymerization that results in the formation of (co)polymers having predictable molecular weight and molecular weight distribution. The ATRP process is also described as providing highly uniform products having controlled structure (i.e., controllable topology, composition, etc.). The '548 and '487 patents and WO 97/18247 patent publication also describe (co)polymers prepared by ATRP, which are useful in a wide variety of applications, for example, with paints and coatings.

The ATRP method is described as one example of a "living polymerization," i.e., a chain-growth polymerization that propagates with essentially no chain transfer and essentially no chain termination. The molecular weight of a polymer prepared by ATRP can be controlled by the stoichiometry of the reactants, i.e., the initial concentration of monomer(s) and initiator(s). In addition, ATRP also provides polymers having characteristics including, for example, narrow molecular weight distributions, e.g., PDI values less than 2.5, and well defined polymer chain structure, e.g., block copolymers and alternating copolymers. When the reactive material used in (f) has at least one epoxy functional group and at least one halide functional group, the resulting microparticles may be used as initiators in living polymerization processes such as ATRP, allowing for the growth of carefully structured and customized polymer chains from the microparticle surfaces. Additional controlled "living polymerization" techniques include reversible addition-fragmentation chain transfer (RAFT) or nitroxide-mediated polymerization (NMP). When the reactive material used in (f) has at least one epoxy functional group and at least one thiocarbonylthio functional group, the resulting microparticles may be used as initiators in RAFT polymerization processes. When the reactive material used in (f) has at least one epoxy functional group and at least one alkoxyamine functional group, the resulting microparticles may be used as initiators in NMP polymerization processes.

Also, the method for producing a non-aqueous dispersion of photosensitive microparticles in accordance with the present invention, can comprise:

a) preparing an aqueous dispersion of a substantially hydrophilic prepolymer component;
b) preparing an aqueous dispersion of a substantially hydrophobic prepolymer component, wherein the dispersion of a) and/or b) further comprises a photosensitive material;
c) combining the dispersions of a) and b) to form a mixture and subjecting the mixture to conditions sufficient to form microparticles;
d) polymerizing the prepolymer components in the mixture;
e) combining the mixture with an organic continuous phase comprising an organic solvent, typically a polar solvent;
f) removing water from the mixture such that the final water content of the non-aqueous dispersion is less than 30 percent by weight; and
g) reacting any acid functional groups in the microparticles with a reactive material having at least one epoxy functional group and at least one hydroxyl functional group, at least one thiocarbonylthio functional group, at least one alkoxyamine functional group, or at least one halide functional group. Step f) may be performed before or after e).

Adjuvant materials also can be incorporated into the non-aqueous dispersion, e.g., conventional ingredients that aid in processing the polymerizable component or impart desired characteristics to the resulting microparticles. Examples of such ingredients include rheology control agents, surfactants, initiators, catalysts, cure-inhibiting agents, reducing agents, acids, bases, preservatives, crosslinking materials, free radical donors, free radical scavengers, stabilizers such as ultraviolet and thermal stabilizers, and adhesion promoting agents, such as organofunctional silanes, siloxanes, titanates and zirconates, which adjuvant materials are known to those skilled in the art.

The non-aqueous dispersions of the present invention may optionally include other colorants such as nanopigments, nanotints, and/or non-photosensitive dyes. Such colorants are particularly useful in the preparation of so-called "dark-to-darker" coating compositions. The term "nanopigment" refers to a pigment for which the mean size of the primary particles is up to 100 nm.

As previously stated, the aqueous dispersion used to prepare the non-aqueous dispersions of the present invention may comprise at least one polymerizable component comprising at least one substantially hydrophilic monomer and at least one substantially hydrophobic monomer. As used herein, the terms "substantially hydrophilic monomer" and "substantially hydrophobic monomer" refer to the relative hydrophilic or hydrophobic character of the monomers compared one to the other. The substantially hydrophilic monomer of the polymerizable component is more hydrophilic than the substantially hydrophobic monomer. Correspondingly, the substantially hydrophobic monomer of the polymerizable component is more hydrophobic than the substantially hydrophilic monomer. One method of determining the hydrophilic/hydrophobic character of a material is the well-known Hydrophilic-Lipophilic Balance (HLB) number. HLB numbers generally range from 1 to 20, with 1 being an oil-soluble material and 20 being a water-soluble material. Using this system, materials designated herein as substantially hydrophobic would demonstrate an HLB of less than 10 while materials designated as substantially hydrophilic would demonstrate an HLB of greater than 10.

The proportions of the substantially hydrophilic monomer (s) to the substantially hydrophobic monomer(s) can vary widely. For example, the weight percent of the substantially hydrophilic monomer and the substantially hydrophobic monomer in the polymerizable component can each range from 2 to 98 weight percent, based on the total polymerizable component solids weight of 100 percent. Examples of proportions of substantially hydrophilic monomers to substantially hydrophobic monomers are 20:80 and 50:50.

In certain instances, the substantially hydrophilic monomer is substantially compatible with water, has an affinity for water, and/or is capable of at least partially dissolving in water using conventional mixing means. The substantially hydrophilic monomers used in the polymerizable monomer component of the present invention can comprise any hydrophilic monomer known to those skilled in the art. Examples of such hydrophilic monomers include monomers comprising hydrophilic functional groups such as: acid-functional groups; hydroxyl-functional groups; nitrile-functional groups; amino-functional groups; amide-functional groups; carbamate-functional groups; ionic-functional groups such as quaternary ammonium or sulfonium groups; or mixtures of such functional groups.

The degree of hydrophilicity and hydrophobicity of the monomers used to prepare the polymerizable component can be varied, as is known to those skilled in the art. A substantially hydrophobic monomer of the polymerizable component can be converted into a substantially hydrophilic monomer. For example, isocyanato groups on a hydrophobic monomer of the polymerizable component can be functionalized with siloxane groups by reacting the isocyanato groups with an organofunctional silane such as aminopropyl triethoxysilane. Upon dispersion in water, the hydrolyzable groups, e.g., alkoxysilanes, are at least partially hydrolyzed to form hydrophilic silanol groups. If allowed to react with alcohol or themselves, these hydrophilic groups can revert to hydrophobic groups. The same functionalization process can be performed with available isocyanato groups on the polymerized and crosslinked photosensitive polymeric microparticles.

Examples of suitable organo-functional silanes for such a hydrophobic to hydrophilic conversion process include: 4-aminobutyltriethoxysilane, carboxymethyltriethoxysilane, isocyanatopropyltriethoxysilane, 3-mercaptopropyltrimethoxysilane, mercaptomethylmethyl-diethoxysilane, or mixtures thereof.

Examples of hydrophilic acid-functional group-containing monomers include acrylic acid, methacrylic acid, beta-carboxyethyl acrylate, acryloxypropionic acid, 2-acrylamide methylpropane sulfonic acid, acrylic(3-sulfopropyl)ester acids, crotonic acid, dimethylolpropionic acid, fumaric acid, mono($C_1$-$C_8$)alkyl esters of fumaric acid, maleic acid, mono ($C_1$-$C_8$)alkyl esters of maleic acid, itaconic acid, mono($C_1$-$C_8$)alkyl esters of itaconic acid and mixtures thereof.

Examples of hydrophilic hydroxyl-functional group-containing monomers include 2-hydroxyethyl methacrylate, 2-hydroxyethyl acrylate, poly(ethylene glycol) acrylate, poly (ethylene glycol) methacrylate, hydroxypropyl methacrylate, hydroxypropyl acrylate, hydroxybutyl methacrylate, hydroxybutyl acrylate, hydroxymethyl ethyl acrylate, hydroxy methylpropyl acrylate, dicaprolactone acrylate, diethanolamine, dimethanolamine or mixtures thereof. Examples of nitrile-functional group-containing monomers include methacrylonitriles and acrylonitriles.

Examples of hydrophilic amino-functional group-containing monomers include allylamine, dimethylallylamine, 2-(dimethylamino)ethyl methacrylate, 2-(t-butylamino)ethyl methacrylate, 4-aminostyrene, dimethylaminoethyl vinyl ether, and N-(3-dimethylaminopropyl)methacrylamide.

Examples of hydrophilic ionic-functional group-containing monomers include allyltrimethylammonium chloride, 2-trimethylammonium ethyl acrylic chloride, and vinylbenzyl dimethyl sulfonium chloride.

Examples of hydrophilic amide-functional group-containing monomers include methacrylamides and acrylamides.

Examples of hydrophilic carbamate-functional group-containing monomers include allyl carbamate, vinyl carbamate, the reaction product of hydroxyethyl carbamate and methacrylic anhydride, and the reaction product of hydroxyethyl carbamate with isophorone di-isocyanate and hydroxyethyl acrylate.

Examples of hydrophilic vinyl-functional group-containing monomers include vinyl acetate, vinyl pyrrolidones and vinyl propionates.

In one example of the present invention, the hydrophobic monomer(s) comprise a monomer that is substantially free of hydrophilic functionality and is substantially incompatible with water, has less affinity for water and/or is capable of only minimally dissolving in water using conventional mixing means. The hydrophobic monomer(s) used in the polymerizable component can include any hydrophobic monomer known to those skilled in the art. Examples of hydrophobic functional groups include hydrocarbons having 4 or more carbon atoms. Further examples of such functional groups are included in the description of hydrophobic monomers hereinafter.

Examples of hydrophobic monomers include free-radically polymerizable monomers which include vinyl aromatic monomers, e.g., styrene, α-methyl styrene, t-butyl styrene and vinyl toluene; vinyl and vinylidene halides, e.g., vinyl chloride and vinylidene chloride; vinyl esters; vinyl ethers, vinyl butyrates, alkyl esters of acrylic and methacrylic acids having from 4 to 17 carbon atoms in the alkyl group, including butyl methacrylate, butyl acrylate, cyclohexyl methacrylate, 4-tert-butylcyclohexylacrylate, cyclohexyl acrylate, 2-ethylhexyl methacrylate, 2-ethylhexyl acrylate, butyl hexylmethacrylate, butyl hexylacrylate, isooctylmethacrylate, isooctylacrylate, isodecyl methacrylate, isodecyl acrylate, isobornyl methacrylate, isobornyl acrylate, lauryl methacrylate and lauryl acrylate; and mixtures thereof.

Other suitable hydrophobic monomers include organofunctional silanes having substantially non-hydrolyzable substituents, such as alkoxy groups having 3 or more carbon atoms.

In certain examples of the present invention, the polymerizable component comprises at least one copolymerizable material that is different from the at least one substantially hydrophilic monomer and the at least one substantially hydrophobic monomer. Also, the copolymerizable material(s) can be reacted with the substantially hydrophilic monomer(s) to form a substantially hydrophilic prepolymer and/or with the substantially hydrophobic monomer(s) to form a substantially hydrophobic prepolymer.

The copolymerizable material(s) can be any material that is copolymerizable with at least one of the substantially hydrophilic monomer(s) and the substantially hydrophobic monomer(s). In one example, the copolymerizable material(s) is a structural backbone forming material. Examples of copolymerizable material(s) can be chosen from: ethylenically unsaturated group-containing materials; isocyanate-containing materials known to those skilled in the art, e.g., reaction products of isocyanates and other correspondingly reactive materials, e.g., polyols, in which the reaction product has at least one reactive isocyanato group; hydroxyl-group containing monomers known to those skilled in the art; epoxy-group containing monomers known to those skilled in the art; carboxy-group containing monomers known to those skilled in the art; carbonate-group containing monomers known to those skilled in the art, e.g., a reaction product of a polyol comprising at least one carbonate group and vinyl monomer and a reaction product of a polyol comprising at least one carbonate group and an isocyanate comprising one reactive isocyanate group and at least one polymerizable double bond as described in U.S. Patent Application Publication US 2003/0136948 (now U.S. Pat. No. 6,998,072) paragraphs [0041] to [0065], which disclosure is incorporated herein by reference; or mixtures of such copolymerizable materials.

The copolymerizable material(s) may include silyl-group containing materials, e.g. organo-functional silanes having at least one polymerizable group, such as the previously described organo-functional silanes.

Examples of copolymerizable materials such as ethylenically unsaturated group-containing monomers include vinyl monomers and ethylenically unsaturated monomers having a functional group chosen from hydroxyl, carboxyl, amino, mercapto, (meth)acryloyloxy, e.g., methacryloyloxy or acryloyloxy, isocyanato or mixtures thereof, which are known to those skilled in the art. In one embodiment, the copolymerizable materials can have two or more of the same polymerizable group or two or more of different polymerizable groups. In another embodiment, the copolymerizable material is chosen from (meth)acrylic monomers having at least one functional group chosen from hydroxyl, amino, mercapto or mixtures thereof.

In one example of the invention, the substantially hydrophilic monomer(s) and/or the substantially hydrophobic monomer(s) used in the formation of the polymerizable component are chosen for the properties provided by the glass transition temperatures of the respective polymers upon polymerization, as is known to those skilled in the art. For example, monomers that form polymers having glass transition temperatures higher than room temperature, e.g. 23° C., tend to form rigid or hard polymers while monomers that form polymers having glass transition temperatures less than room temperature tend to be soft and flexible. The properties of the monomers used to form the polymeric microparticle environment can affect the performance of the photosensitive materials. For example, in the case of organic photochromic materials that depend on conformational changes to demonstrate an activated and unactivated state, a soft and flexible environment permits more movement and can allow an increase in performance or a rigid and hard environment permits less movement and can cause a decrease in performance. Formulating the polymerizable component with materials having properties that can affect the performance of the photosensitive materials enables the resulting photosensitive polymeric microparticle to have an environment in which the performance of the photosensitive materials can be controlled independently of the environment surrounding the photosensitive polymeric microparticle. For example, the photosensitive polymeric microparticle can itself be soft and flexible but be surrounded by or imbedded within a rigid and hard matrix or environment.

Upon polymerization, the substantially hydrophilic monomer(s) and the substantially hydrophobic monomer(s) each form polymers, the glass transition temperatures of which can vary widely. For example, the glass transition temperature of a polymer formed upon polymerization of the substantially hydrophobic monomer(s) may be greater than or equal to the glass transition temperature of the polymer formed upon polymerization of the substantially hydrophilic monomer(s). Alternatively, the glass transition temperature of the polymer formed upon polymerization of the substantially hydrophobic monomer(s) may be less than the glass transition temperature of the polymer formed upon polymerization of the substantially hydrophilic monomer(s).

In a further example of the present invention, the substantially hydrophobic monomer(s) is adapted to form a polymer that upon polymerization has a glass transition temperature less than 23° C., e.g., from 22.9° C. to −100° C. or from 22° C. to −90° C. The substantially hydrophilic monomer(s) may also be adapted to form a polymer that upon polymerization has a glass transition temperature equal to or greater than 23° C., e.g., from 23° C. to 130° C. or from 24° C. to 100° C.

In certain instances, the substantially hydrophilic monomer(s) and/or the substantially hydrophobic monomer(s) can be urethane materials adapted to form substantially rigid and/or substantially flexible segments. The concept of preparing urethane material in order to form rigid or flexible segments by choosing the components, e.g., isocyanates and polyols, to form the appropriate type of segment is known to those skilled in the art. See for example the discussion of hard and soft segments in U.S. Pat. No. 6,187,444, at column 3, line 49 to column 4, line 46, which disclosure is incorporated herein by reference. A rigid segment of urethane material is one that gives the resulting material in which it is used a stiffness that is not easily bent without breaking. A flexible segment of urethane material is one that results in a material being pliable and capable of being bent or moved from a straight line or form without breaking. In one example, the substantially hydrophobic monomer is a urethane material, e.g., a urethane (meth)acrylate prepolymer, that is adapted to form a flexible-segment and the substantially hydrophilic monomer(s) is a urethane material, e.g., a urethane (meth)acrylate prepolymer, adapted to form a rigid-segment. In addition, the substantially hydrophobic monomer(s) may be a urethane material that is adapted to form a rigid-segment and the substantially hydrophilic monomer(s) is a urethane material adapted to form a flexible-segment.

The urethane materials of the present invention can be prepared with isocyanates and polyols, amines and/or thiols that can vary widely. Suitable materials and methods are known to those skilled in the art of urethane preparation.

When the urethane-forming components, such as organic components having hydroxyl, mercapto and/or amino groups and isocyanates, are combined to produce the urethane materials of the present invention, the relative amounts of the ingredients are typically expressed as a ratio of the available number of reactive isocyanate groups to the available number of reactive hydroxyl, mercapto and/or amino groups, e.g., an equivalent ratio of NCO:X wherein X is OH, SH, NH and/or $NH_2$. For example, a ratio of NCO:X of 1.0:1.0 is obtained when the weight of one NCO equivalent of the isocyanate component is reacted with the weight of one X equivalent of the hydroxyl, mercapto and/or amino group-containing component. The urethane materials have an equivalent ratio of NCO:X that can vary widely. For example, the equivalent ratio of NCO:X can range between 0.3:1.0 and 3.0:1.0 and all inclusive ranges therebetween. When the ratio is greater than 1.0:1.0, the excess isocyanato groups can be blocked and/or further reacted, e.g., with urea or organo-functional silanes, to form hydrophilic groups, as is known to those skilled in the art.

Examples of isocyanate components include modified or unmodified isocyanates having free, blocked, e.g., with suitable blocking agents, or partially blocked isocyanate-containing components, as known to those skilled in the art, chosen from: toluene-2,4-diisocyanate; toluene-2,6-diisocyanate; diphenyl methane-4,4'-diisocyanate; diphenyl methane-2,4'-diisocyanate; para-phenylene diisocyanate; biphenyl diisocyanate; 3,3'-dimethyl-4,4'-diphenylene diisocyanate; tetramethylene-1,4-diisocyanate; hexamethylene-1,6-diisocyanate; 2,2,4-trimethyl hexane-1,6-diisocyanate; lysine methyl ester diisocyanate; bis(isocyanato ethyl) fumarate; isophorone diisocyanate; ethylene diisocyanate; dodecane-1,12-diisocyanate; cyclobutane-1,3-diisocyanate; 2-heptyl-3,4-bis(9-isocyanatononyl)-1-pentyl-cyclohexane; cyclohexane-1,3-diisocyanate; cyclohexane-1,4-diisocyanate; dicyclohexylmethane-4,4-diisocyanate or methylene bis (4-cyclohexylisocyanate); methyl cyclohexyl diisocyanate; hexahydrotoluene-2,4-diisocyanate; hexahydrotoluene-2,6-diisocyanate; hexahydrophenylene-1,3-diisocyanate; hexahydrophenylene-1,4-diisocyanate; m-tetramethylxylene diisocyanate; p-tetramethylxylene diisocyanate; perhydrodiphenylmethane-2,4'-diisocyanate; perhydrodiphenylmethane-4,4'-diisocyanate or mixtures thereof. Triisocyanates such as biurets of any suitable diisocyanate including 1,4-tetramethylene diisocyanate and 1,6-hexamethylene diisocyanate may be used. Also, biurets of cycloaliphatic diisocyanates such as isophorone diisocyanate and 4,4'-methylene-bis-(cyclohexyl isocyanate) can be employed. Examples of suitable aralkyl diisocyanates from which biurets may be prepared are meta-xylylene diisocyanate and α,α,α',α'-tetramethylmeta-xylylene diisocyanate. Other trifunctional isocyanates may also be used, for example, trimers of isophorone diisocyanate, triisocyanato nonane, triphenylmethane triisocyanate, 1,3,5-benzene triisocyanate, 2,4,6-toluene triisocyanate, an adduct of trimethylol and tetramethyl xylene diisocyanate sold under the trade name CYTHANE 3160 by CYTEC Industries, and DESMODUR N 3300 and DESMODUR N 3600, which are trimers of hexamethylene diisocyanate, available from Bayer Corporation.

When the substantially hydrophilic monomer is prepared from triisocyanates (isocyanurates in particular), the non-aqueous dispersions containing photosensitive microparticles prepared therefrom may be formulated into coatings containing aminoplast resins, which as a result demonstrate improved adhesion to substrates in boiling water as measured by haze, compared to similar coatings prepared with non-aqueous dispersions containing photosensitive microparticles prepared from diisocyanates. Other advantages of tri-isocyanates include faster fade kinetics of photochromic microparticles prepared therefrom, compared to similar photochromic microparticles prepared from diisocyanates. Also, a substantially hydrophilic monomer prepared from a triisocyanate tends to have better long-term stability than an analogous hydrophilic monomer prepared from a diisocyanate.

When the urethane material is formed in the presence of a catalyst, the catalyst can be chosen from: Lewis bases, Lewis acids and insertion catalysts, as is described in *Ullmann's Encyclopedia of Industrial Chemistry,* 5th Edition, 1992, Volume A21, pp. 673 to 674, which disclosure is incorporated herein by reference.

Non-limiting examples of organic polyols that can be used in the present invention as urethane-forming components can include (a) polycarbonate polyols; (b) low molecular weight polyols, e.g., polyols having a weight average molecular weight less than 500, e.g., aliphatic diols, such as C2-C10 aliphatic diols, triols, polyhydric alcohols and alkoxylated low molecular weight polyols; (c) polyester polyols; (d) polyether polyols; (e) amide-containing polyols; (f) polyacrylic polyols; (g) epoxy polyols; (h) polyhydric polyvinyl alcohols; (i) urethane polyols; or (j) mixtures thereof. The aforementioned polycarbonate polyols can be formed by methods known in the art, as disclosed in U.S. Pat. Nos. 5,143,997 at column 3, line 43 to column 6, line 25, and 5,527,879 at column 2, line 10 to column 3, line 48. For example, polycarbonates are customarily obtained from the reaction of alcohols or phenols with phosgene or from the transesterification of alcohols or phenols with dialkyl or diaryl carbonates. In particular aspects of the present invention, polycarbonate functional dials are used that have been prepared by the reaction of a diol such as 1,6-hexanediol, $C_2$ (ethylene glycol) to $C_{36}$ diols such as neopentylglycol, butanediol, 1,10-decanediol, butylethyl propanediol, 2-ethyl-1,3-hexanediol, cyclohexanedimethanol, 2,2,4-trimethylpentane-1,3-diol, Esterdiol 204, and/or polytetrahydrofuran (Mn 250), with either phosgene or dimethylcarbonate. Polycarbonate dials of Mn <2000 are preferred and polycarbonate dials of Mn <1000 are most preferred. The use of such polycarbonate functional diols is particularly suitable when the non-aqueous dispersions are to be used in the preparation of solventborne coating compositions that contain non-hydroxyl solvents; e.g., esters, ethers, aromatic hydrocarbons, and/or ketones. Improved compatibility is demonstrated between the microparticles and solvents, evidenced by reduced particle aggregation.

The other polyols can also be prepared by methods known in the art, as described in U.S. Pat. No. 6,187,444 at column 7, line 25 to column 12, line 15. Such disclosures are hereby incorporated herein by reference.

The organic polyols, e.g., diols, triol, etc., that are used to prepare the urethane material of the present invention, can be used to form prepolymers or adducts with the isocyanates. Alternatively, substantially hydrophilic or substantially hydrophobic prepolymers can each be prepared by the reaction of a hydrophilic monomer, such as dimethylol propionic acid, or a hydrophobic monomer, such as a $C_8$ aliphatic diol, with the isocyanate reactive group of the prepolymer. Such prepolymers can be substantially hydrophilic or substantially hydrophobic urethane (meth)acrylate prepolymers, e.g., urethane acrylate prepolymers, urethane methacrylate prepolymers or a mixture thereof.

The non-aqueous dispersions of the present invention include an effective amount of at least one photosensitive material. The term "an effective amount of photosensitive material" means that amount of photosensitive material in the polymerizable component and resulting photosensitive polymeric microparticle which, when irradiated with an appropriate wavelength of electromagnetic radiation, produces a detectable response by instrument or visual observation such as a change in the wavelength or amount of radiation emitted by the photosensitive material, a change in the wavelength of the radiation passing through the photosensitive material or a change in the observed color of the photosensitive material. The term "photosensitive materials" includes photosensitive organic materials, photosensitive inorganic materials or mixtures thereof, but does not include colorants such as pigments and fixed tint dyes and conventional dichroic dyes unless the dichroic property is associated with a photochromic material as discussed hereinafter although such colorants may be included in the non-aqueous dispersions and curable film-forming compositions of the present invention. The photosensitive material may be chosen from fluorescent dyes, phosphorescent dyes, nonlinear optical materials, photochromic materials or mixtures thereof.

The photosensitive material(s) can further comprise one or more polymerizable groups described hereinbefore. Various methods for attaching polymerizable groups to photosensitive materials are known to those skilled in the art. See for example, U.S. Pat. No. 6,113,814 at column 8, line 42 to column 22, line 7, which disclosure is incorporated herein by reference. Additional methods that can be employed are those used for attaching functional groups to non-photosensitive materials, such as the methods described in U.S. Pat. No. 5,919,846 at column 2, line 35 to column 4, line 42. The photosensitive material can be at least partially bound to the chain-like polymeric materials of the polymerizable component.

As known to those skilled in the art, fluorescent and phosphorescent dyes emit visible radiation when an atom or molecule passes from a higher to a lower electronic state. The difference between the two dyes being that the emission of luminescence after exposure to radiation from the fluorescent dye occurs sooner than that from a phosphorescent dye.

Fluorescent dyes known to those skilled in the art can be used as photosensitive materials in the present invention. See Haugland, R. P. (1996) *Molecular Probes Handbook for Fluorescent Probes and Research Chemicals,* 6th edition. Examples of fluorescent dyes include anthracenes, tetracenes, pentacenes, rhodamines, benzophenones, coumarins, fluoresceins, perylenes and mixtures thereof.

Phosphorescent dyes known to those skilled in the art can be used as photosensitive materials in the present invention. Examples of suitable phosphorescent dyes can include: metal-ligand complexes such as tris(2-phenylpyridine)iridium [Ir(ppy)3]; 2,3,7,8,12,13,17,18-octaethyl-21H,23H-porphyrin platinum (II) [PtOEP] and organic dyes such as eosin (2',4',5',7'-tetrabromofluorescein), 2,2'-bipyridine and erythrosin (2',4',5',7'-tetraiodofluorescein).

Non-linear optical materials (NLO) can have a distinct crystalline structure, which is optically anisotropic with respect to electromagnetic radiation, but can also be amorphous, e.g., gallium arsenate, as well as polymeric incorporating a variety of chromophores such as disperse red 1 [2873-52-8] 4-(N-ethyl-N-2-hydroxyethyl)amino-4'-nitroazobenzene. As used herein the term "anisotropic" means having at least one property that differs in value when measured in at least one different direction. Thus, "optically anisotropic materials" are materials that have at least one optical property that differs in value when measured in at least one different direction. Based on the anisotropic nature of NLO materials, ordering or alignment of the materials, as known to those skilled in the art, is used to take full advantage of the nonlinear behavior of these materials. Some NLO materials change light passing through them, depending upon orientation, temperature, light wavelength etc. An example of this property of NLO materials is that a red light of low wavelength enters a crystal of ammonium dihydrogen phosphate which releases photons of accumulated higher energy and exits as blue light of a higher wavelength. See, D. Arivuoli "Fundamentals of nonlinear optical materials" PRAMANA-journal of physics Vol 57, Nos 5 &6 November & December 2001, pp. 871-883, which disclosure is incorporated herein by reference.

NLO materials known to those skilled in the art can be used as photosensitive materials in the present invention. See Nalwa, H. S. and Miyata, S, Editors, *Nonlinear Optics of Organic Molecules and Polymers* by CRC, 1997. Examples of NLO materials in addition to the aforementioned materials include: 4-dimethylamine-4-nitrostilbene; 4-[4-(phenylazo)-1-naphthylazo]phenol; N-ethyl-N-(2-hydroxyethyl)-4-(4-nitrophenylazo)aniline; and (S)-(−)-1-(4-nitrophenyl)-2-pyrrolidinemethanol.

Photochromic materials have at least two states, a first state having a first absorption spectrum and a second state having a second absorption spectrum that differs from the first absorption spectrum, and are capable of switching between the two states in response to at least actinic radiation of at least two different wavelengths. For example, Isomer A of a photochromic material at the first absorption spectrum, e.g., a "clear" state, is exposed to light of a first wavelength and isomerizes to Isomer B at the second absorption spectrum, e.g., a "colored" state, which when exposed to light of a second and different wavelength or when exposure to the light of a first wavelength is discontinued isomerizes back to Isomer A. Typically, photochromic materials in the clear state are considered as "unactivated" and in the colored state, are "activated." Within the class of photochromic materials, there are thermally reversible and non-thermally reversible photochromic materials. Thermally reversible photochromic materials are capable of switching between a first and a second state in response to at least actinic radiation and reverting back to the first state in response to thermal energy, e.g., any form of heat, or removal of the activating radiation. Non-thermally reversible (or photo-reversible) photochromic materials are adapted to switch states in response to actinic radiation, but not thermal energy. As used herein "actinic radiation" means electromagnetic radiation, such as ultraviolet and visible radiation that is capable of causing a response in photochromic materials.

Both thermally reversible and non-thermally reversible photochromic materials can be adapted to display both photochromic and dichroic, e.g., at least partially linearly polarizing, properties under appropriate conditions and are referred to as photochromic-dichroic materials. As used herein, "at least partially linearly polarizing" means to confine from some to all of the vibrations of the electric field vector of lightwaves to one direction or plane. As discussed below in more detail, the photosensitive articles comprising optically anisotropic materials such as non-linear optical materials and/or photochromic-dichroic materials can be at least partially aligned.

Non-limiting examples of photochromic materials can include a wide variety of photochromic materials that can be used as photosensitive materials in the present invention. The photochromic material is typically chosen from an inorganic photochromic material, an organic photochromic material or a mixture thereof.

For example, the inorganic photochromic material may comprise crystallites of silver halide, cadmium halide and/or copper halide. Other inorganic photochromic materials can be prepared by the addition of europium (II) and/or cerium (III) to a mineral glass such as a soda-silica glass. In one example, the inorganic photochromic materials are added to molten glass and formed into particles that are incorporated into the aqueous composition of the present invention to form microparticles comprising such particulates. The glass particulates can be formed by any of a number of various methods known in the art. The inorganic photochromic materials are further described in *Kirk Othmer Encyclopedia of Chemical Technology*, 4th Edition, Volume 6, pages 322-325.

As another possibility, the photochromic material may be at least one organic photochromic material comprising at least one activated absorption maxima in the range from 300 to 1000 nanometers, as is known to those skilled in the art. In a further example, the organic photochromic material comprises a mixture of (a) at least one organic photochromic material having a visible lambda max of from 400 to less than 550 nanometers, and (b) at least one organic photochromic material having a visible lambda max of from 550 to 700 nanometers.

The photochromic material can include the following classes of materials: pyrans, oxazines, fulgides, fulgimides, diarylethenes or mixtures thereof. The photochromic material(s) can be a thermally reversible photochromic material and/or a non-thermally reversible photochromic material. For example, the photochromic material(s) may be chosen from thermally reversible pyrans, thermally reversible oxazines, thermally reversible fulgides, thermally reversible fulgimides or mixtures thereof. According to another example, the photochromic material(s) is a non-thermally reversible fulgide, non-thermally reversible fulgimide, non-thermally reversible diarylethene or a mixture thereof. The photochromic material may also be a photochromic-dichroic material.

Examples of photochromic pyrans that can be used herein include benzopyrans, and naphthopyrans, e.g., naphtho[1,2-b]pyrans, naphtho[2,1-b]pyrans, and indeno-fused naphthopyrans, such as those disclosed in U.S. Pat. No. 5,645,767 at column 2, line 16 to column 12, line 57, and heterocyclic-fused naphthopyrans, such as those disclosed in U.S. Pat. Nos. 5,723,072 at column 2, line 27 to column 15, line 55, 5,698,141 at column 2, line 11 to column 19, line 45, 6,153,126 at column 2, line 26 to column 8, line 60, and 6,022,497 at column 2, line 21 to column 11, line 46, which disclosures are hereby incorporated herein by reference, and spiro-9-fluoreno[1,2-b]pyrans, phenanthropyrans, quinolinopyrans; fluoroanthenopyrans and spiropyrans, e.g., spiro(benzindoline)naphthopyrans, spiro(indoline)benzopyrans, spiro(indoline)naphthopyrans, spiro(indoline)quinolinopyrans and spiro(indoline)pyrans. More specific examples of naphthopyrans and complementary organic photochromic substances are described in U.S. Pat. No. 5,658,501 at column 1, line 64 to column 13, line 17, which disclosure is hereby incorporated herein by reference. Spiro(indoline)pyrans are also described in the text, *Techniques in Chemistry*, Volume III, "Photochromism", Chapter 3, Glenn H. Brown, Editor, John Wiley and Sons, Inc., New York, 1971, which is also hereby incorporated herein by reference.

Non-limiting examples of photochromic oxazines that can be used include benzoxazines, naphthoxazines, and spiro-oxazines, e.g., spiro(indoline)naphthoxazines, spiro(indoline)pyridobenzoxazines, spiro(benzindoline)pyridobenzoxazines, spiro(benzindoline)naphthoxazines, spiro(indoline)benzoxazines, spiro(indoline)fluoranthenoxazine, and spiro(indoline)quinoxazine.

Non-limiting examples of thermally reversible photochromic fulgides or fulgimides that can be used include: fulgides and fulgimides, which are disclosed in U.S. Pat. No. 4,685,783 at column 1, line 57 to column 5, line 27, the disclosure of which is hereby incorporated herein by reference, and mixtures of any of the aforementioned photochromic materials/compounds.

When the photochromic material comprises at least two photochromic compounds, the photochromic compounds can be linked to one another via linking group substituents on the individual photochromic compounds. For example, the photochromic materials can be polymerizable photochromic compounds or photochromic compounds that are adapted to be compatible with a host material ("compatibilized photochromic materials"). Examples of polymerizable photochromic materials that can be used herein are disclosed in U.S. Pat. No. 6,113,814 at column 2, line 23 to column 23, line 29, which disclosure is hereby incorporated herein by reference. Examples of compatibilized photochromic materials that can be used herein are disclosed in U.S. Pat. No. 6,555,028 at column 2, line 40 to column 25, line 26, which disclosure is hereby incorporated herein by reference. A polymerizable photochromic material that is substantially hydrophilic can be used as the substantially hydrophilic monomer in the polymerizable component. A polymerizable photochromic material that is substantially hydrophobic can be used as the substantially hydrophobic monomer in the polymerizable component.

Other suitable photochromic groups and complementary photochromic groups are described in U.S. Pat. Nos. 6,080,338 at column 2, line 21 to column 14, line 43; 6,136,968 at column 2, line 43 to column 20, line 67; 6,296,785 at column 2, line 47 to column 31, line 5; 6,348,604 at column 3, line 26 to column 17, line 15; 6,353,102 at column 1, line 62 to column 11, line 64; and 6,630,597 at column 2, line 16 to column 16, line 23. The aforesaid disclosures of the aforementioned patents are hereby incorporated herein by reference.

Still further suitable photochromic materials include photochromic-dichroic materials, such as the materials disclosed in U.S. Patent Application Publication No. 20050004361, (now U.S. Pat. No. 7,342,112) from paragraph [0024] to [00157], which disclosure is incorporated herein by reference. Such material can be used to provide polarizing properties to microparticles that are at least partially aligned as described hereinafter. Examples of such photochromic-dichroic compounds include:

(1) 3-phenyl-3-(4-(4-(3-piperidin-4-yl-propyl)piperidino) phenyl)-13,13-dimethyl-indeno[2',3':3,4]-naphtho[1,2-b] pyran;
(2) 3-phenyl-3-(4-(4-(3-(1-(2-hydroxyethyl)piperidin-4-yl) propyl)piperidino)phenyl)-13,13-dimethyl-indeno[2',3':3, 4]naphtho[1,2-b]pyran;
(3) 3-phenyl-3-(4-(4-(4-butyl-phenylcarbamoyl)-piperidin-1-yl) phenyl)-13,13-dimethyl-6-methoxy-7-(4-phenyl-piperazin-1-yl)indeno[2',3':3,4]naphtho[1,2-b]pyran;
(4) 3-phenyl-3-(4-([1,4]bipiperidinyl-1'-yl)phenyl)-13,13-dimethyl-6-methoxy-7-([1,4']bipiperidinyl-1'-yl)indeno [2',3':3,4]naphtho[1,2-b]pyran;
(5) 3-phenyl-3-(4-(4-phenyl-piperazin-1-yl)phenyl)-13,13-dimethyl-6-methoxy-7-(4-(4-hexylbenzoyloxy)-piperidin-1-yl)indeno[2',':3,4]naphtho[1,2-b]pyran; or
(6) mixtures of such pyrans.

In addition to the aforementioned photochromic materials, an example of non-thermally reversible diarylethene photochromic material is described in U.S. Patent Application 2003/0174560 from paragraph [0025] to [0086], and a non-thermally reversible fulgide or fulgimide is described in U.S. Pat. No. 5,631,382 at column 2, line 35 to column 12, line 8, which disclosures are hereby incorporated herein by reference.

In certain examples of the present invention, the photosensitive material comprises a photochromic material comprising a pyran chosen from:
(a) 3,3-di(4-methoxyphenyl)-6,11,13-trimethyl-13-(2-(2-(2-hydroxyethoxy)ethoxy)ethoxy)-3H,13H-indeno[2',3':3,4] naphtho[1,2-b]pyran;
(b) 3-(4-methoxyphenyl)-3-(4-(2-hydroxyethoxy)phenyl)-13,13-dimethyl-3H,13H-indeno[2',3':3,4]naphtho[1,2-b] pyran;
(c) 3-(4-methoxyphenyl)-3-(4-(2-hydroxyethoxy)phenyl)-6,7-dimethoxy-11-trifluoromethyl-13,13-dimethyl-3H, 13H-indeno[2',3':3,4]naphtho[1,2-b]pyran;
(d) 3,3-di(4-methoxyphenyl)-13,13-dimethyl-3H,13H-indeno[2',3':3,4]naphtho[1,2-b]pyran;
(e) 3-(4-methoxyphenyl)-3-(4-(2-hydroxyethoxy)phenyl)-6, 11-difluoro-13,13-dimethyl-3H,13H-indeno[2',3':3,4] naphtho[1,2-b]pyran; or
(f) mixtures of such pyrans.

Methods of making photochromic materials with and without at least one polymerizable group are well known to those skilled in the art. For example, and without limitation, 3,3-di (4-methoxyphenyl)-6,11,13-trimethyl-13-(2-(2-(2-hydroxyethoxy)ethoxy)ethoxy-3H,13H-indeno[2,1-f]naphtho[1,2-b] pyran (Photochromic Material A), can be prepared by following the process of Example 8 of U.S. Pat. No. 6,113,814, which example is incorporated herein by reference, except that in Step 7 of the process, triethylene glycol is used in place of diethylene glycol.

A photochromic material such as (b) 3-(4-(2-hydroxyethoxy)phenyl)-3-(4-methoxyphenyl)-13,13-dimethyl-3H, 13H-indeno[2',3':3,4]naphtho[1,2-b]pyran (Photochromic Material B), can be prepared by reacting 7,7-dimethyl-5-hydroxy-7H-benzo[C]fluorene with 1-(4-(2-hydroxyethoxy) phenyl)-1-(4-methoxyphenyl)-2-propyn-1-ol using procedures known to those skilled in the art.

A photochromic material such as (c) 3-(4-methoxyphenyl)-3-(4-(2-hydroxyethoxy)phenyl)-6,7-dimethoxy-11-trifluoromethyl-13,13-dimethyl-3H,13H-indeno[2',3':3,4] naphtho[1,2-b]pyran (Photochromic Material C) can be prepared following the procedure of Example 1 in U.S. Patent Application Publication 2008/0103301 except that 1-(4-(2-hydroxyethoxy)phenyl)-1-(4-methoxyphenyl)-2-propyn-1-ol would be used in place of 1,1-bis(4-methoxyphenyl)-2-propyn-1-ol in Step 6, which example is hereby incorporated herein by reference.

A photochromic material such as (d) 3,3-di(4-methoxyphenyl)-6,11-dimethoxy-13-butyl-13-(2-hydroxyethoxy)-3H,13H-indeno[2',3':3,4]naphtho[1,2-b]pyran (Photochromic Material D), can be prepared by using the same process as described above for Photochromic Material A, except that 3,3-di(4-methoxyphenyl)-6,11-dimethoxy-13-butyl-13-hydroxy-3H,13H-indeno[2',3':3,4]naphtho[1,2-b]pyran and ethylene glycol are reacted together in Step 7 of Example 8 of U.S. Pat. No. 6,113,814.

A photochromic material such as (e) 3-(4-methoxyphenyl)-3-(4-(2-hydroxyethoxy)phenyl)-6,1'-difluoro-13,13-dimethyl-3H,13H-indeno[2',3':3,4]naphtho[1,2-b]pyran (Photochromic Material E), can be prepared by following the procedure of Example 1 of U.S. Pat. No. 7,556,751 B2 except that 1-(4-(2-hydroxyethoxy)phenyl)-1-(4-methoxyphenyl)-2-propyn-1-ol would be used in place of 1,1-bis(4-methoxyphenyl)-2-propyn-1-ol in Step 5, which example is hereby incorporated herein by reference.

A photochromic material such as 3,3-di(4-methoxyphenyl)-6-methoxy-7-morpholino-13-ethyl-13-(2-(2-hydroxyethoxy)ethoxy)-3H,13H-indeno[2',3':3,4]naphtho[1,2-b]pyran can be prepared by reacting 2-morpholino-3-methoxy-5, 7-dihydroxy-7-ethyl-7H-benzo[C]fluorene, which can be prepared by following Step 2 of Example 9 of U.S. Pat. No. 6,296,785 using the appropriately substituted starting material (which example is hereby incorporated herein by reference) with 1,1-bis(4-methoxyphenyl)-2-propyn-1-ol, which can be prepared by following the method of Step 1 of Example 1 of U.S. Pat. No. 5,458,814 (which example is hereby incorporated herein by reference) using procedures known to those skilled in the art.

Similarly, a photochromic material such as 3-(4-fluorophenyl)-3-(4-methoxyphenyl)-6,7-dimethoxy-13-ethyl-13-(2-(2-hydroxyethoxy)ethoxy)-3H,13H-indeno[2',3':3,4]naphtho[1,2-b]pyran, can be prepared by following the process used for Photochromic Material A except by using 3-(4-fluorophenyl)-3-(4-methoxyphenyl)-6,7-dimethoxy-13-ethyl-13-hydroxy-3H,13H-indeno[2',3':3,4]naphtho[1,2-b] pyran and diethylene glycol in the process.

A photochromic material such as 3,3-di(4-methoxyphenyl)-6,11,13-trimethyl-13-hydroxy-3H,13H-indeno[2,1-f] naphtho[1,2-b]pyran, can be prepared by following the method of Example 5 of U.S. Pat. No. 5,645,767, which example is incorporated herein by reference.

The photosensitive materials described herein can be chosen from a variety of materials. Examples include: a single photosensitive compound; a mixture of photosensitive compounds; a material comprising at least one photosensitive compound, such as a polymeric resin or an organic monomeric solution; a material such as a monomer or polymer to which at least one photosensitive compound is chemically bonded; a photosensitive polymer, e.g., a photochromic polymer comprising photochromic compounds bonded together; or mixtures thereof.

In one circumstance, when the photosensitive material is an organic photochromic material comprising at least one polymerizable group and the copolymerizable material is present, the polymerizable component comprises from 2 to 25 weight percent of substantially hydrophilic prepolymer, from 2 to 25 weight percent of substantially hydrophobic prepolymer, from 1 to 45 weight percent of the photochromic material and from 5 to 95 weight percent of one or more copolymerizable monomers, based on the total weight of solids of the polymerizable component being 100 percent. In another example of the present invention, the polymerizable component comprises from 10 to 25 weight percent of substantially hydrophilic prepolymer, from 10 to 25 weight percent of substantially hydrophobic prepolymer, from 5 to 15 weight percent of the photochromic material and from 35 to 75 weight percent of one or more copolymerizable monomers. The individual components of the polymerizable component can each range in all numerical amounts between any combination of their respective ranges inclusive of the aforestated ranges. Often, the organic photochromic is present in an amount of up to 50 weight percent of the total weight of solids of the polymerizable component.

Often, the non-aqueous dispersions prepared by the methods of the present invention contain at least partially crosslinked photosensitive polymeric microparticles comprising an at least partially polymerized component comprising integral surface and interior domains wherein said surface domain comprises at least one substantially hydrophilic region, said interior domain comprises at least one substantially hydrophobic region, and at least one of said surface and/or interior domains is photosensitive. In certain examples, the surface and/or interior domain that is photosensitive comprises an effective amount of at least one photosensitive material chosen from fluorescent materials, phosphorescent materials, nonlinear optical materials, photochromic materials or mixtures thereof. In a further example, the interior domain is adapted to be photosensitive. Often, the photosensitive material is substantially non-extractable and more often, the photosensitive material is a photochromic material.

The at least partially crosslinked polymeric microparticles are formed by the self-assembly and partial polymerization of the polymerizable component in an aqueous environment. During self-assembly of the microparticles, the substantially hydrophilic regions orient to the exterior and form the surface domain and the substantially hydrophobic regions orient to the interior and form the interior domain. As used herein the terms "surface domain" means the contiguous region of the outside of the microparticles (shell) and "interior domain" comprises the contiguous region of the inside of the microparticles (core), all of which domains are integral.

The at least one photosensitive material can be adapted to be substantially non-extractable. The non-extractable photosensitive material is often a photochromic material, typically an organic photochromic material, which may be substituted with at least one polymerizable group. By substantially non-extractable is meant that a microparticle of substantially non-extractable photosensitive material will release less photosensitive material than a microparticle of an identical photosensitive material that is substantially extractable since measures to prevent extraction were not taken, e.g., providing the photosensitive material with at least one polymerizable group capable of reacting with the polymerizable component as described hereinafter.

The relative extractability of photosensitive materials from the photosensitive polymeric microparticles (using organic photochromic materials as an example) can be tested by including an effective amount of the photochromic polymeric microparticles of a substantially non-extractable photochromic material, such as Photochromic A described herein before, which has at least one polymerizable group capable of reacting with the polymerizable component, in one portion of a coating composition of the film-forming type used in the examples and including an effective amount of photochromic polymeric microparticles of a substantially extractable photochromic material, such as Photochromic F described herein before, which does not have a polymerizable group capable of reacting with the polymerizable component, in another portion of the coating composition. The term "effective amount" in this illustration means that a sufficient amount of photochromic polymeric microparticles are used to produce a photochromic effect discernible to the naked eye upon activation. The coating compositions containing each type of photochromic polymeric microparticles are applied as at least partial coatings to lenses and at least partially cured as described in the examples herein. The at least partially cured coated lenses as well as an uncoated lens of the same material are each measured for their absorbance at a suitable wavelength, e.g., 390 nanometers (nm), to measure the initial amounts of photochromic materials as well as the absorbance of the lens material. The absorbance of the uncoated lens is subtracted from the absorbance of each of the coated lenses to account for the ultraviolet stabilizers typically present in such lens material. The coated lenses as well as an uncoated lens are immersed in separate containers of equivalent amounts of a solvent in which the photosensitive material is at least partially soluble, such as tetrahydrofuran (THF) which solvent is maintained at 23° C., e.g., room temperature. At intervals of 30 minutes, each of the lenses is removed, dried and tested for their absorbance at 390 nm and the absorbance of the uncoated lens is subtracted from each of the at least partially coated lenses. This is continued until the absorbance readings for the coated lenses do not significantly change indicating that the extractable amount of photochromic material has been extracted.

Regarding the photosensitive polymeric microparticles of the present invention, the amount of substantially non-extractable photosensitive material released from the photosensitive polymeric microparticles in comparison to the amount of extractable photosensitive material released by the photosensitive polymeric microparticles can vary from slightly less to significantly less. Stated another way, microparticles containing substantially non-extractable photosensitive materials can release from 10% less to 100% less photosensitive material than the microparticles containing extractable photochromic materials.

The photosensitive material can be made substantially non-extractable by trapping due to its being trapped within the resulting polymeric network of the polymeric microparticle (typically an at least partially crosslinked polymer microparticle) as a result of the size of the photosensitive material; for example, a particulate photosensitive material, e.g., a glass particulate comprising inorganic photochromic materials, or a photochromic oligomer or photochromic polymer having a number average weight and/or configuration which would be expected to be trapped by size. Alternatively, the photosensitive material is at least partially bound to the polymeric network by covalent bonds, e.g., by at least one functional group reactive with the surface and/or interior domains. Often the photosensitive material is held by a combination of factors including physical size, hydrogen bonding and covalent bonding.

It has been observed that substantially non-extractable organic photosensitive materials, e.g., organic photochromic materials, remain in the physical phase in which they were added. For example, the substantially non-extractable organic photochromic materials associated with the substantially hydrophobic region of the interior domain do not tend to migrate into the substantially hydrophilic region of the surface domain and crystallize.

The size of the photosensitive polymeric microparticles of the present invention can vary widely. For example, the size of the microparticles of the present invention can range from an average particle size, e.g., a volume average particle size as determined by a laser diffraction particle size instrument that measures the size of the particles assuming that each particle has a spherical shape, yielding a "particle size" referring to the diameter of the smallest sphere that will completely enclose the particle, of from 10 to 10,000 nanometers (nm) or from 20 to 5000 nm or from 30 to 1500 nm or from 40 to 1000 nm or from 50 to 500 nm or from 60 to 200 nm. The average particle size of the photosensitive polymeric microparticles have a range that varies between any of the aforementioned values, inclusive of the recited values, e.g., from 40 to 120 nm.

When the average particle size of the photosensitive polymeric microparticles is less than 50 nm, the size can be determined by ultraviolet or X-ray-laser scattering methods, atomic force microscopy, neutron scattering or other methods known to those skilled in the art. When the average particle size is greater than 50 nanometers and up to 1000 nm, the average particle size can be measured according to known visible-laser scattering techniques or it can be determined by visually examining an electron micrograph of a transmission electron microscopy ("TEM") image, measuring the diameter of the particles in the image, and calculating the average particle size based on the magnification of the TEM image. When the average particle size is greater than 1000 nm, the size can be measured by using light microscope methods known to those skilled in the art.

The aforementioned photosensitive polymeric microparticles may comprise functionality that can react with crosslinking materials. Such functionality also enables the photosensitive polymeric microparticles to react with components of host materials, e.g., polymeric organic materials, to make the photosensitive polymeric microparticles more compatible with the host. By the term "more compatible" is meant that the combination of the photosensitive polymeric microparticles and host material would be less likely to demonstrate cloudiness or haze, which is a typical indication of a lack of compatibility. In one example, at least a portion of the functionality adapted to react is hydrophilic, for example, hydroxyl functional groups derived from the reaction of acid groups on the surface of the microparticles with epoxy functionality on the reactive material described above. Examples of functional groups include: hydroxyl, epoxy, carbamate, amino, mercapto, amide and/or urea groups.

In regards to the crosslinking materials, the crosslinking materials may be chosen from: materials comprising two or more sites of reactive unsaturation; materials comprising two or more of the aforementioned functional groups; materials comprising one or more sites of reactive unsaturation and one or more of the aforementioned functional groups: or mixtures of such crosslinking materials. Examples of crosslinking materials for hydroxyl, carboxyl, amide, and carbamate functional group containing materials include aminoplast resins, phenoplast resins or mixtures thereof. Examples of aminoplast resins are commercially available from CYTEC Industries, Inc., under the trademark CYMEL, e.g., CYMEL® 327, 328, 345, 350, 370 and 385 and from Ineos under the trademark RESIMENE Polyisocyanates and blocked polyisocyanates and polyaziridines can be used as crosslinking materials for hydroxyl and primary and/or secondary amino group-containing materials. Examples of polyisocyanates and blocked isocyanates suitable for use as crosslinking agents for the photosensitive microparticles of the present invention are those described in U.S. Pat. No. 4,546,045 at col. 5, lines 16 to 38; and in U.S. Pat. No. 5,468,802 at col. 3, lines 48 to 60, which disclosures are hereby incorporated herein by reference.

Examples of crosslinking materials for hydroxyl and primary and/or secondary amino groups include anhydrides that are well known in the art. Examples of anhydrides suitable for use as crosslinking materials are those described in U.S. Pat. No. 4,798,746 at col. 10, lines 16 to 50; and in U.S. Pat. No. 4,732,790 at col. 3, lines 41 to 57, which disclosures are hereby incorporated herein by reference.

Non-limiting examples of crosslinking materials for epoxy functional group containing materials are polyacids that are well known in the art. Non-limiting examples of polyacids suitable for use as crosslinking materials are those described in U.S. Pat. No. 4,681,811 at col. 6, line 45 to col. 9, line 54, which disclosure is hereby incorporated herein by reference.

Non-limiting examples of crosslinking materials for carbonates and unhindered esters include polyamines that are well known in the art. Examples of polyamines suitable for use as crosslinking materials for the photosensitive polymeric microparticles of the present invention are those described in U.S. Pat. No. 4,046,729 at col. 6, line 61 to col. 7, line 26, which disclosure is hereby incorporated herein by reference.

Non-limiting examples of crosslinking materials for hydroxyl functional group containing materials include siloxanes, silanes and/or hydrolysates of each that are typical components of hardcoat producing coating solutions such as Hi-Gard® coating solutions, sold by PPG Industries, Inc. Further examples include silyl substituted materials such as tris[3(trimethoxysilyl)propyl]isocyanurate, which are well known in the art.

When desired and appropriate, mixtures of the aforementioned crosslinking materials can be used.

Reactivity with crosslinking materials and additional physical properties, such as those described hereinafter, can be associated with the photosensitive polymeric microparticles of the present invention. The microparticles can be adapted to have these properties by incorporation of materials conferring such properties during the formation of the polymerizable component and/or after formation of the at least partially crosslinked photosensitive polymeric microparticles.

The photosensitive polymeric microparticle can be rendered magnetic or magnetically responsive by the introduction of magnetic materials and/or magnetically responsive metal oxides during and/or after preparation of the microparticles. Examples of such materials can include, but are not limited to, superparamagnetic metal oxides, paramagnetic metal oxides, ferromagnetic metal oxides, e.g. ferrite, or mixtures thereof, as known by those skilled in the art. Magnetic particulates are commercially available from Dynal Biotech or can be prepared using art-recognized methods, such as those disclosed in, for example, U.S. Pat. Nos. 4,358,388 at column 1, line 42 to column 7, line 39, and 5,356,713 at column 1, line 47 to column 5, line 12, which disclosures are hereby incorporated herein by reference.

The photosensitive polymeric microparticles can be electrically conductive by incorporating electrically conductive materials into the photosensitive polymeric microparticles. Electrically conductive fillers, such as carbon fillers, carbon blacks or metal fibers can be incorporated during and/or after preparation of the microparticles. The amount of electrically conductive material added can vary widely provided that the percolation threshold, e.g., the concentration of filler at which the microparticles will conduct an electrical current, is met or exceeded. Electrically conductive polymers can be incorporated into the microparticle by including monomers of such polymers in the polymerizable component. Examples of conductive polymers include: polyaniline-based polymers, polypyrrole-based polymers, polythiophene-based polymers, polyethyleneoxide-based polymers or copolymers thereof. The preparation and use of electrically conductive materials can be accomplished using techniques well known to those skilled in the art. See *Kirk Othmer Encyclopedia of Chemical Technology*, Fourth Edition, Volume 9, "Electrically Conductive Polymers," pages 61-88, which disclosure is hereby incorporated herein by reference.

Coloration can be incorporated within the photosensitive polymeric microparticles by the introduction of non-photosensitive dyes and/or pigments into the polymerizable component and/or microparticles to make the microparticles chromatic. Examples of non-photosensitive dyes and pigments include a wide variety of organic or inorganic materials known to those skilled in the art. Examples of non-photosensitive dyes include fixed tints such as soluble and dispersible tints. Examples of pigments include organic metal oxides, and powders and organic pigments such as animal, vegetable or synthetic pigments. The aforementioned non-photosensitive organic dyes and pigments can also be polymerizable as discussed hereinafter using dichroic materials as an example.

Examples of organic pigments, can include quinacridones, phthalocyanines, isoindolines, anthrapyrimidines, anthanthrones, flavanthrones, perinones, pyranthrones, substituted derivatives thereof, and mixtures thereof. Examples of inorganic pigments include titanium dioxide, iron oxide, chromium oxide, lead chromate, carbon black or mixtures thereof.

The photosensitive polymeric microparticles of the present invention can be made at least partially polarizing by incorporating photochromic-dichroic materials, as previously described, and/or conventional dichroic materials and at least partially aligning them. Dichroic materials are capable of absorbing one of two orthogonal plane polarized components of transmitted radiation more strongly than the other. Thus, dichroic materials are capable of at least partially linearly polarizing transmitted radiation. However, although dichroic materials are capable of preferentially absorbing one of two orthogonal plane polarized components of transmitted radiation, if the molecules of the dichroic compound are not suitably positioned or arranged, no net linear polarization of transmitted radiation will be achieved. That is, due to the random positioning of the molecules of the dichroic material, selective absorption by the individual molecules will cancel each other such that no net or overall linear polarizing effect is achieved. Thus, it is generally necessary to suitably position or arrange, e.g., at least partially align, the molecules of a dichroic material within another material in order to form a conventional linear polarizing element. For example by the stretching of a polymeric sheet to align the dichroic material to produce a linearly polarizing filter or lens for sunglasses, as is known to those skilled in the art.

Non-limiting examples of suitable conventional dichroic materials can include azomethines, indigoids, thioindigoids, merocyanines, indans, quinophthalonic dyes, perylenes, phthaloperines, triphenodioxazines, indoloquinoxalines, imidazo-triazines, tetrazines, azo and (poly)azo dyes, benzoquinones, naphthoquinones, anthroquinone and (poly)anthroquinones, anthropyrimidinones, iodine and iodates. The dichroic material can be a polymerizable dichroic material. That is, the dichroic material can comprise at least one polymerizable group. For example, although not limiting herein, the at least one dichroic material can have at least one alkoxy, polyalkoxy, alkyl, or polyalkyl substituent terminated with at least one polymerizable group.

The phrase "subjecting a material to conditions sufficient to at least partially form microparticles", as mentioned in the various methods of producing a non-aqueous dispersion of photosensitive microparticles, includes subjecting the material to high shearing stress conditions to particularize the material into microparticles. The high shearing stress can be accomplished by any of the high shearing stress techniques known to those skilled in the art.

As used herein, the term "high shearing stress conditions" is meant to include not only high shearing stress techniques, such as the liquid-liquid impingement techniques discussed in detail below, but also high speed shearing by mechanical means. It should be understood that, if desired, any mode of applying stress to the aqueous composition can be utilized so long as sufficient stress is applied to achieve particularization of the aqueous composition to form microparticles.

The aqueous composition can be subjected to the appropriate shearing stress conditions by use of a MICROFLUIDIZER® emulsifier which is available from Microfluidics Corporation in Newton, Mass. The MICROFLUIDIZER® high-pressure impingement emulsifier is described in detail in U.S. Pat. No. 4,533,254, which is incorporated herein by reference. The device consists of a high-pressure (up to about $1.4 \times 10^5$ kPa (20,000 psi)) pump and an interaction chamber in which emulsification takes place. In one example, a pre-emulsion of the admixture is prepared prior to subjecting it to high shearing stress. The pump forces the admixture into the chamber where it is split into at least two streams which pass at very high velocity through at least two slits and collide, resulting in the formation of small particles, e.g., the admixture is "particularized".

Each aqueous composition may be passed through the emulsifier at a pressure of between about $3.5 \times 10^4$ and about $1 \times 10^5$ kPa (5,000 and 15,000 psi) multiple times or until at least partially formed microparticles are produced. Multiple passes of each of the aqueous compositions within the emulsifier can result in microparticles having a smaller average particle size and a narrower range for the particle size distribution. When using the aforesaid MICROFLUIDIZER® emulsifier, stress is applied by liquid-liquid impingement. As mentioned above, other modes of applying stress to the pre-emulsification admixture can be utilized so long as sufficient stress is applied to achieve at least partially formed microparticles which can be further reduced in size by multiple passes. For example, alternative methods of applying high shearing stress conditions would be the use of ultrasonic energy, homogenizers, rotor/stator mixers and/or jet dispersers.

Polymerization of the polymerizable components of the at least partially formed photosensitive polymeric microparticles can be accomplished by irradiating the composition with an initiating amount of radiation and/or adding to the composition an initiating amount of material e.g., an initiator, capable of enabling polymerization to occur by methods such as free radical polymerization, thermal polymerization, photopolymerization or a combination thereof. Methods for polymerizing the materials used to prepare the photosensitive polymeric microparticles of the present invention are well known to the skilled artisan and any of those well known techniques can be used.

For example, the polymerizable components can be at least partially polymerized by thermal polymerization, e.g. at temperatures ranging from 22° C. to 150° C., by photopolymerization or by a combination of the two methods. While a range of temperatures has been described for the thermal polymerization of the polymerizable components in the at least partially formed microparticles, it will be recognized by persons skilled in the art that temperatures other than those disclosed herein may be used.

Methods for initiating polymerization by irradiation include the use of ultraviolet, visible, infrared, microwave, gamma or electron beam radiation so as to initiate the polymerization reaction of the polymerizable components. This can be followed by a thermal step to cure any unreacted polymerizable materials.

Polymerization of the polymerizable components can be done by including in the aqueous composition an initiating amount of material capable of generating free radicals, such as organic peroxy compounds or azobis(organonitrile) compounds, e.g., an initiator. Examples of suitable organic peroxy compounds, that can be used as thermal polymerization initiators include: t-butyl hydroperoxide, peroxymonocarbonate esters, such as tertiarybutylperoxy isopropyl carbonate; peroxydicarbonate esters, such as di(2-ethylhexyl) peroxydicarbonate, di(secondary butyl) peroxydicarbonate and diisopropylperoxydicarbonate; diacylperoxides, such as 2,4-dichlorobenzoyl peroxide, isobutyryl peroxide, decanoyl peroxide, lauroyl peroxide, propionyl peroxide, acetyl peroxide, benzoyl peroxide, p-chlorobenzoyl peroxide; peroxyesters such as t-butylperoxy pivalate, t-butylperoxy octylate, and t-butyl peroxyisobutyrate; methylethylketone peroxide, and acetylcyclohexane sulfonyl peroxide. The thermal initiators are those that do not discolor the resulting polymeric microparticle and can participate in an oxidation-reduction initiator system that does not require additional heat, as known to those skilled in the art. See, for example, "Redox Polymerization" by G. S. Misra, Prog. Polym. Sci. Vol 8, pp. 61-131, 1982, which disclosure is incorporated herein by reference.

Examples of suitable azobis(organonitrile) compounds, that can be used as thermal polymerization initiators include: 2,2'-azobis(2,4-dimethylpentanenitrile, 1,1'-azobiscyclohexanecarbonitrile, azobisisobutyronitrile or mixtures thereof.

The amount of thermal polymerization initiator used to initiate and polymerize the polymerizable components can vary and will depend on the particular initiator used. Only that amount that is required to initiate and sustain the polymerization reaction is required. With respect to azobis(organonitrile) compounds, between 0.01 and 5.0 parts of that initiator per 100 parts of the polymerizable components (phm) can be used. Typically, the thermal cure cycle involves heating the polymerizable components in the presence of the initiator to temperatures in a range from room temperature up to 125° C. over a period of from 20 minutes to 2 hours. While a range of time has been described for thermal polymerization of the polymerizable components in the at least partially formed microparticles, it will be recognized by persons skilled in the art that time intervals other than those disclosed herein can be used.

Photopolymerization of the polymerizable components can be carried out in the presence of a photoinitiator using ultraviolet light and/or visible light. Examples of photoinitiators that can be used include cleavage-type photoinitiators and abstraction-type photoinitiators.

Non-limiting examples of cleavage-type photoinitiators include acetophenones, α-aminoalkylphenones, benzoin ethers, benzoyl oximes, acylphosphine oxides and bisacylphosphine oxides or mixtures of such initiators. A commercial example of such a photoinitiator is DAROCURE® 4265, which is available from Ciba Chemicals, Inc. Examples of abstraction-type photoinitiators include benzophenone, Michler's ketone, thioxanthone, anthraquinone, camphorquinone, fluorone, ketocoumarin or mixtures of such initiators.

Abstraction-type photoinitiators typically function better in the presence of materials such as amines and other hydrogen donor materials added to provide labile hydrogen atoms for abstraction. Typical hydrogen donors have an active hydrogen positioned alpha to an oxygen or nitrogen, e.g., alcohols, ethers and tertiary amines, or an active hydrogen atom directly attached to sulfur, e.g., thiols. In the absence of such added materials, photoinitiation can still occur via hydrogen abstraction from monomers, oligomers or other components of the system.

Cationic photoinitiators can also be used in conjunction with the aforementioned photoinitiators. Examples of cationic initiators used with abstraction type photoinitiators are hydrogen donor materials such as butyryl choline triphenylbutyl borate, or combinations of such materials. Further examples of cationic photoinitiators are onium salts described in U.S. Pat. No. 5,639,802, column 8, line 59 to column 10, line 46, which disclosure is incorporated herein by reference.

The amount of photopolymerization initiator used to initiate and polymerize the polymerizable components of the at least partially formed microparticles can vary and will depend on the particular initiator used. Only that amount that is required to initiate and sustain the polymerization reaction is required. The photopolymerization initiator can be used in amounts of from 0.01% to 5% by weight, based on the weight of polymerizable components.

The light source used for the photopolymerization is selected from those which emit ultraviolet light and/or visible light. The light source can be a mercury lamp, a mercury lamp doped with FeI3 and/or GaI3, a germicidal lamp, a xenon lamp, a tungsten lamp, a metal halide lamp or a combination of such lamps. Typically, the absorbance spectra of the photoinitiator or photoinitiator combination is matched with the spectral output of the bulb, for example, H bulb, D bulb, Q bulb and/or V bulb for highest curing efficiency. The exposure time can vary depending upon the wavelength and intensity of the light source, the photoinitiator, and the polymerizable components. The at least partially formed microparticles can also be at least partially polymerized by using an electron beam process which does not require the presence of an initiator.

A further description of initiators and methods for the polymerization of the polymerizable components in the photosensitive microparticles using thermal and/or photopolymerization methods is disclosed in U.S. Pat. No. 6,602,603 at column 11, line 1 to column 13, line 36, and U.S. Pat. No. 7,001,952 at column 11 line 15 to line 50, which disclosures are incorporated herein by reference.

The present invention also provides a curable, photosensitive film-forming composition prepared from (a) a film-forming component comprising at least one material having reactive functional groups and (b) a non-aqueous dispersion of photosensitive polymeric microparticles such as any of those described above. Such film-forming compositions are often solventborne; suitable solvents include those known in the art of coating formulations, e.g., alcohols, such as butanol; ketones, such as methyl amyl ketone; aromatic hydrocarbons, such as xylene, AROMATIC/SOLVESSO 100, a blend of aromatic solvents available from Exxon Mobil Chemicals; and glycol ethers, such as alkylene glycol monoalkyl or dialkyl ethers; esters such as alkoxyalkyl acetates; and mixtures of any of the foregoing.

The film-forming component (a) may comprise an alkoxide of the general formula $R_xM(OR')_{z-x}$ where R is an organic radical, M is silicon, aluminum, titanium, and/or zirconium, each R' is independently an alkyl radical, z is the valence of M, and x is a number less than z, and may be equal to zero. Such alkoxides are useful in the preparation of sol-gel, i.e., solution-gelation coatings. Examples of suitable organic radicals include alkyl, vinyl, methoxyalkyl, phenyl, 3-glycidoxy propyl and 3-methacryloxy propyl. The alkoxide can be further mixed and/or reacted with other compounds and/or polymers known in the art. Particularly suitable are compositions comprising siloxanes formed from at least partially hydrolyzing an organoalkoxysilane. Examples of suitable alkoxide-containing compounds and methods for making them are described in U.S. Pat. Nos. 6,355,189; 6,264,859; 6,469,119; 6,180,248; 5,916,686; 5,401,579; 4,799,963; 5,344,712; 4,731,264; 4,753,827; 4,754,012; 4,814,017; 5,115,023; 5,035,745; 5,231,156; 5,199,979; and 6,106,605. Such alkoxides and the preparation thereof are described in detail in United States Patent Application Publication Number 20060246305, paragraphs [0015] to [0023], incorporated herein by reference. The use of such alkoxides allows for decreased interference and minimal differences in refractive index between the film-forming composition and the substrate, particularly when the substrate is a high refractive index optical grade substrate as discussed below.

Additionally, or alternatively, the film-forming component (a) may comprise any of the crosslinking materials listed above, such as an aminoplast, including self-condensing aminoplasts.

The film-forming component (a) may comprise thermosetting polymeric materials, thermoplastic polymeric materials or a mixture of such polymeric materials. For example, the film-forming component (a) may comprise a thermosetting polymeric material that is chosen from polyurethanes, polyols in combination with capped or free polyisocyanates, poly(urea-urethanes), aminoplast resins, polysiloxanes, polyanhydrides, polyacrylamides, epoxy resins or poly(meth) acrylates, e.g., polymethacrylates, polyacrylates or mixtures thereof. The film-forming component (a) may alternatively comprise one or more different ethylenically unsaturated monomers, curable using actinic radiation such as UV radiation.

When the film-forming component (a) comprises polyols in combination with capped or free polyisocyanates, useful polyisocyanates are numerous and widely varied. Examples can include aliphatic polyisocyanates, cycloaliphatic polyisocyanates wherein one or more of the isocyanato groups are attached directly to the cycloaliphatic ring, cycloaliphatic polyisocyanates wherein one or more of the isocyanato groups are not attached directly to the cycloaliphatic ring, aromatic polyisocyanates wherein one or more of the isocyanato groups are attached directly to the aromatic ring, and aromatic polyisocyanates wherein one or more of the isocyanato groups are not attached directly to the aromatic ring, and mixtures thereof. When an aromatic polyisocyanate is used, generally care should be taken to select a material that does not cause the polyurethane-containing to color (e.g., yellow).

The polyisocyanate can include aliphatic or cycloaliphatic diisocyanates, aromatic diisocyanates, cyclic dimers and cyclic trimers thereof, and mixtures thereof. Examples of suitable polyisocyanates can include Desmodur N 3300 (hexamethylene diisocyanate trimer) which is commercially available from Bayer; Desmodur N 3400 (60% hexamethylene diisocyanate dimer and 40% hexamethylene diisocyanate trimer). Also suitable is Trixene BL 7960, a blocked isocyanate available from Baxenden Chemicals, Ltd. The polyisocyanate can include dicyclohexylmethane diisocyanate and isomeric mixtures thereof. As used herein and the claims, the term "isomeric mixtures" refers to a mixture of the cis-cis, trans-trans, and/or cis-trans isomers of the polyisocyanate. Examples of isomeric mixtures for use in the present invention can include the trans-trans isomer of 4,4'-methylenebis (cyclohexyl isocyanate), hereinafter referred to as "PICM" (paraisocyanato cyclohexylmethane), the cis-trans isomer of PICM, the cis-cis isomer of PICM, and mixtures thereof.\

Suitable isomers for use in the present invention can include the following three isomers of 4,4'-methylenebis(cyclohexyl isocyanate).

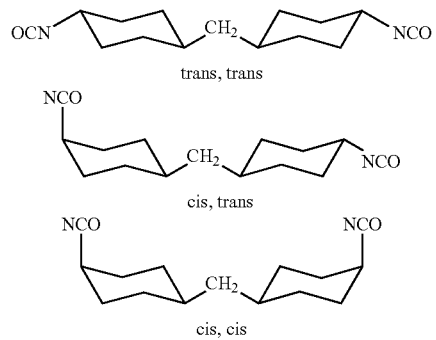

PICM can be prepared by phosgenating 4,4'-methylenebis (cyclohexyl amine) (PACM) by procedures well known in the art such as the procedures disclosed in U.S. Pat. Nos. 2,644, 007; 2,680,127 and 2,908,703; which are incorporated herein by reference. The PACM isomer mixtures, upon phosgenation, can produce PICM in a liquid phase, a partially liquid phase, or a solid phase at room temperature. Alternatively, the PACM isomer mixtures can be obtained by the hydrogenation of methylenedianiline and/or by fractional crystallization of PACM isomer mixtures in the presence of water and alcohols such as methanol and ethanol.

Additional aliphatic and cycloaliphatic diisocyanates that can be used include 3-isocyanato-methyl-3,5,5-trimethyl cyclohexyl-isocyanate ("IPDI") which is commercially available from Arco Chemical, and meta-tetramethylxylene diisocyanate (1,3-bis(1-isocyanato-1-methylethyl)-benzene) which is commercially available from Cytec Industries Inc. under the trade name TMXDI® (Meta) Aliphatic Isocyanate.

As used herein and the claims, the term "aliphatic and cycloaliphatic diisocyanates" refers to 6 to 100 carbon atoms linked in a straight chain or cyclized having two diisocyanate reactive end groups. The aliphatic and cycloaliphatic diisocyanates for use in the present invention can include TMXDI and compounds of the formula $R—(NCO)_2$ wherein R represents an aliphatic group or a cycloaliphatic group.

The polyol in the film-forming component (a) may comprise a compound having at least two active hydrogen groups comprising OH groups and may additionally include primary amine groups, secondary amine groups, thiol groups, and combinations thereof. A single polyfunctional compound having only OH groups is typically used; likewise, a single polyfunctional compound having mixed functional groups may be used.

Suitable OH-containing materials for use in the present invention in the preparation of the polyurethane material in the film-forming component can include polyether polyols, polyester polyols, polycaprolactone polyols, polycarbonate polyols, and mixtures thereof.

Examples of polyether polyols are polyalkylene ether polyols which include those having the following structural formula:

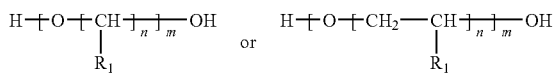

where the substituent R1 is hydrogen or lower alkyl containing from 1 to 5 carbon atoms including mixed substituents, and n is typically from 2 to 6 and m is from 8 to 100 or higher. Included are poly(oxytetramethylene) glycols, poly(oxytetraethylene) glycols, poly(oxy-1,2-propylene) glycols, and poly(oxy-1,2-butylene) glycols. Examples of alkylene oxides can include ethylene oxide, propylene oxide, butylene oxide, amylene oxide, aralkylene oxides, such as styrene oxide, mixtures of ethylene oxide and propylene oxide. Polyoxyalkylene polyols can be prepared with mixtures of alkylene oxide using random or step-wise oxyalkylation.

Also useful are polyether polyols formed from oxyalkylation of various polyols, for example, diols such as ethylene glycol, 1,6-hexanediol, Bisphenol A and the like, or other higher polyols such as trimethylolpropane, pentaerythritol, and the like. Polyols of higher functionality which can be utilized as indicated can be made, for instance, by oxyalkylation of compounds such as sucrose or sorbitol. One commonly utilized oxyalkylation method is reaction of a polyol with an alkylene oxide, for example, propylene or ethylene oxide, in the presence of an acidic or basic catalyst. Particular polyethers include those sold under the names TERATHANE and TERACOL, available from E. I. Du Pont de Nemours and Company, Inc., and POLYMEG, available from Q 0 Chemicals, Inc., a subsidiary of Great Lakes Chemical Corp.

Polyether glycols for use in the present invention can include polytetramethylene ether glycol.

The polyether-containing polyol can comprise block copolymers including blocks of ethylene oxide-propylene oxide and/or ethylene oxide-butylene oxide. Pluronic R, Pluronic L62D, Tetronic R and Tetronic, which are commercially available from BASF, can be used as the polyether-containing polyol material in the present invention.

Suitable polyester glycols can include the esterification products of one or more dicarboxylic acids having from four to ten carbon atoms, such as adipic, succinic or sebacic acids, with one or more low molecular weight glycols having from two to ten carbon atoms, such as ethylene glycol, propylene glycol, diethylene glycol, 1,4-butanediol, neopentyl glycol, 1,6-hexanediol and 1,10-decanediol. The polyester glycols can be the esterification products of adipic acid with glycols of from two to ten carbon atoms.

Suitable polycaprolactone glycols for use in the present invention can include the reaction products of ε-caprolactone with one or more of the low molecular weight glycols listed above. A polycaprolactone may be prepared by condensing caprolactone in the presence of a difunctional active hydrogen compound such as water or at least one of the low molecular weight glycols listed above. Particular examples of polycaprolactone glycols include polycaprolactone polyesterdiols available as CAPA® 2047 and CAPA® 2077 from Solvay Corp.

Polycarbonate polyols are known in the art and are commercially available such as Ravecarb™ 107 (Enichem S.p.A.). The polycarbonate polyol can be produced by reacting an organic glycol such as a diol and a dialkyl carbonate, such as described in U.S. Pat. No. 4,160,853. The polyol can include polyhexamethyl carbonate having varying degrees of polymerization.

The glycol material can comprise low molecular weight polyols such as polyols having a molecular weight of less than 500, and compatible mixtures thereof. As used herein, the term "compatible" means that the glycols are mutually soluble in each other so as to form a single phase. Examples of these polyols can include low molecular weight diols and triols. If used, the amount of triol is chosen so as to avoid a high degree of cross-linking in the polyurethane. A high degree of cross-linking can result in a curable polyurethane that is not formable by moderate heat and pressure. The organic glycol typically contains from 2 to 16, or from 2 to 6, or from 2 to 10, carbon atoms. Examples of such glycols can include ethylene glycol, propylene glycol, diethylene glycol, triethylene glycol, tetraethylene glycol, dipropylene glycol, tripropylene glycol, 1,2-, 1,3- and 1,4-butanediol, 2,2,4-trimethyl-1,3-pentanediol, 2-methyl-1,3-pentanediol, 1,3-2,4- and 1,5-pentanediol, 2,5- and 1,6-hexanediol, 2,4-heptanediol, 2-ethyl-1,3-hexanediol, 2,2-dimethyl-1,3-propanediol, 1,8-octanediol, 1,9-nonanediol, 1,10-decanediol, 1,4-cyclohexanediol, 1,4-cyclohexanedimethanol, 1,2-bis(hydroxyethyl)-cyclohexane, glycerin, tetramethylolmethane, such as pentaerythritol, trimethylolethane and trimethylolpropane; and isomers thereof.

The OH-containing material can have a weight average molecular weight, for example, of at least 60, or at least 90, or at least 200. Additionally, the OH-containing material can have a weight average molecular weight, for example, of less than 10,000, or less than 7000, or less than 5000, or less than 2000.

The OH-containing material for use in the present invention can include teresters produced from at least one low molecular weight dicarboxylic acid, such as adipic acid.

Polyester glycols and polycaprolactone glycols for use in the present invention can be prepared using known esterification or transesterification procedures as described, for example, in the article D. M. Young, F. Hostettler et al., "Polyesters from Lactone," Union Carbide F-40, p. 147.

Polyester glycols can also be prepared from the reaction of 1,6-hexanediol and adipic acid; 1,10-decanediol and adipic acid; or 1,10-decanediol and caprolactone.

In alternate examples, the polyol for use in the present invention can be chosen from: (a) esterification product of adipic acid with at least one diol selected from 1,4-butanediol, 1,6-hexanediol, neopentyl glycol, or 1,10-decanediol; (b) reaction product of E-caprolactone with at least one diol selected from 1,4-butane diol, 1,6-hexane diol, neopentyl glycol, or 1,10-decanediol; (c) polytetramethylene glycol; (d) aliphatic polycarbonate glycols, and (e) mixtures thereof.

Often in the film-forming compositions of the present invention, the photosensitive polymeric microparticles contain functional groups that are reactive with the reactive functional groups in the material in film-forming component (a), allowing the microparticles to become integral to the compositions. Such functional groups may be any of those discussed above.

The film-forming compositions of the present invention may be used to coat substrates and prepare photosensitive coated articles. Such substrates may be optical elements, such as optical memory elements, display elements, ophthalmic elements, window elements or mirror elements.

Upon application to a substrate and curing, the curable film-forming compositions of the present invention often demonstrate a refractive index greater than 1.5, often 1.55 to 1.65, more often 1.58 to 1.60.

The substrate may comprise an at least partially cured polymeric organic material chosen from thermosetting polymeric organic materials, thermoplastic polymeric organic materials or a mixture of such polymeric organic materials. In other instances, the polymeric organic material is chosen from poly(C1-C12 alkyl methacrylates), poly(oxyalkylene dimethacrylates), poly(alkoxylated phenol methacrylates), cellulose acetate, cellulose triacetate, cellulose acetate propionate, cellulose acetate butyrate, poly(vinyl acetate), poly(vinyl alcohol), poly(vinyl chloride), poly(vinylidene chloride), thermoplastic polycarbonates, polyesters, polyurethanes, polythiourethanes, polysulfithiourethanes, poly(urea-urethane), poly(ethylene terephthalate), polystyrene, polyalpha methylstyrene), copoly(styrene-methylmethacrylate), copoly(styrene-acrylonitrile), polyvinylbutyral or polymers prepared from bis(allyl carbonate) monomers, polyfunctional acrylate monomers, polyfunctional methacrylate monomers, diethylene glycol dimethacrylate monomers, diisopropenyl benzene monomers, ethoxylated bisphenol A dimethacrylate monomers, ethylene glycol bismethacrylate monomers, poly(ethylene glycol) bismethacrylate monomers, ethoxylated phenol bis methacrylate monomers, alkoxylated polyhydric alcohol polyacrylate monomers, styrene monomers, urethane acrylate monomers, glycidyl acrylate monomers, glycidyl methacrylate monomers, diallylidene pentaerythritol monomers or mixtures of such monomers.

Substrates suitable for use in the preparation of optical elements of the present invention demonstrate a refractive index of at least 1.55 and include nonplastic substrates such as glass. More often, substrates commonly used in optical applications are used, including polyol(allyl carbonate) monomers, e.g., allyl diglycol carbonates such as diethylene glycol bis(allyl carbonate), which monomer is sold under the trademark CR-39 by PPG Industries, Inc; polyurea-polyurethane (polyurea urethane) polymers, which are prepared, for example, by the reaction of a polyurethane prepolymer and a diamine curing agent, a composition for one such polymer being sold under the trademark TRIVEX by PPG Industries, Inc; polyol(meth)acryloyl terminated carbonate monomer; diethylene glycol dimethacrylate monomers; ethoxylated phenol methacrylate monomers; diisopropenyl benzene monomers; ethoxylated trimethylol propane triacrylate monomers; ethylene glycol bismethacrylate monomers; poly(ethylene glycol) bismethacrylate monomers; urethane acrylate monomers; poly(ethoxylated bisphenol A dimethacrylate); poly(vinyl acetate); poly(vinyl alcohol); poly(vinyl chloride); poly(vinylidene chloride); polyethylene; polypropylene; polyurethanes; polythiourethanes; thermoplastic polycarbonates, such as the carbonate-linked resin derived from bisphenol A and phosgene, one such material being sold under the trademark LEXAN; polyesters, such as the material sold under the trademark MYLAR; poly(ethylene terephthalate); polyvinyl butyral; poly(methyl methacrylate), such as the material sold under the trademark PLEXIGLAS, and polymers prepared by reacting polyfunctional isocyanates with polythiols or polyepisulfide monomers, either homopolymerized or co- and/or terpolymerized with polythiols, polyisocyanates, polyisothiocyanates and optionally ethylenically unsaturated monomers or halogenated aromatic-containing vinyl monomers. Also contemplated are copolymers of such monomers and blends of the described polymers and copolymers with other polymers, e.g., to form interpenetrating network products. Typically, the refractive index of the substrate is between 1.55 and 1.67, often 1.55 to 1.65. Thiourethane, polycarbonate, and/or thio-based polyurethane urea are the most commonly used substrates.

Optical elements include: optical memory elements such as devices for optical memory and image processing; ophthalmic elements such as corrective lenses, non-corrective lenses, contact lenses, intra-ocular lenses, magnifying lenses, protective lenses and visors; window elements such as architectural, automotive, motorcycle and aircraft transparencies, filters, shutters, and optical switches; mirror elements; and display elements such as screens, monitors, liquid crystal cells, organic light emitting devices and security elements.

As used herein the term "optical" means pertaining to or associated with light and/or vision. The optical memory elements can include image processing devices and optical data storage devices. In such optical memory elements the interaction of the device with optical signals causes a change in the optical memory of those devices for a period of time until the change in the form of an image is processed or maintained or until the change in the form of information is maintained until further changed or deleted. As used herein the term "ophthalmic" means pertaining to or associated with the eye and vision. Examples of ophthalmic elements include corrective and non-corrective lenses, including single vision or multi-vision lenses, which may be either segmented or non-segmented multi-vision lenses (such as bifocal lenses, trifocal lenses and progressive lenses), as well as other elements used to correct, protect, or enhance (cosmetically or otherwise) vision, including contact lenses, intra-ocular lenses, magnifying lenses, and protective lenses or visors.

As used herein the term "window" means an aperture adapted to permit the transmission of radiation therethrough. Examples of windows include architectural, automotive and aircraft transparencies, filters, shutters, and optical switches. As used herein the term "mirror element" means a surface that specularly reflects a large fraction of incident light. In the present invention, the reflected light can be modified by the type of photosensitive polymeric microparticle connected to the mirror element.

As used herein the term "display" means the visible or machine-readable representation of information in words, numbers, symbols, designs or drawings. Examples of display elements and devices include screens, monitors, liquid crystal cells, organic light emitting devices and security elements. As used herein the term "liquid crystal cell" refers to a structure containing a liquid crystal material that is an anisotropic material capable of being ordered. Active liquid crystal cells are cells wherein the liquid crystal material is capable of being switched between ordered and disordered states or between two ordered states by the application of an external force, such as electric or magnetic fields. Passive liquid crystal cells are cells wherein the liquid crystal material maintains an ordered state. One example of an active liquid crystal cell element or device is a liquid crystal display.

As used herein the term "order" means bring into a suitable arrangement or position, such as by aligning with another structure or material, or by some other force or effect. Thus, as used herein the term "order" encompasses both contact methods of ordering a material, such as aligning with another structure or material, and non-contact methods of ordering a material, such as by exposure to an external force or effect. The term "order" also encompasses combinations of contact and non-contact methods.

Examples of methods of at least partially ordering liquid crystal materials as well as other anisotropic materials such as nonlinear optical materials, photochromic-dichroic materials as well as dichroic dyes, according to various embodiments disclosed herein using liquid crystal material as an example, include exposing at least a portion of the liquid crystal material to at least one of: a magnetic field, an electric field, linearly polarized infrared radiation, linearly polarized ultraviolet radiation, linearly polarized visible radiation and a shear force.

In addition to the aforementioned methods of at least partially ordering a liquid crystal material, the liquid crystal materials can be at least partially ordered by aligning at least a portion of the liquid crystal material with another material or structure, such as an orientation facility. As used herein the term "orientation facility" means a mechanism that can facilitate the positioning of one or more other structures that are exposed, directly and/or indirectly, to at least a portion thereof. Further information on orientation facilities is disclosed in U.S. Patent Application P-108,935 from paragraphs [0153] to [0288] filed May 17, 2004 which disclosure is hereby incorporated herein by reference.

The optical element may alternatively be chosen from optical memory elements, display elements, ophthalmic elements, window elements or mirror elements. The display element may be chosen from screens, monitors, liquid crystal cells, organic light emitting devices or security elements. The optical element may be an organic light emitting device "OLED" wherein the first surface is an anode, the second surface is a cathode and the material positioned there between is an emissive material, said emissive material being in electrical contact with said anode and said cathode.

When a current is applied to the OLED, the anode injects holes and the cathode injects electrons into the emissive material comprising an effective amount of the photosensitive polymeric microparticles of the present invention. The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism as known to those skilled in the art. See, for example, U.S. Pat. No. 6,687,266 at column 2, line 47 to column 18, line 59, which disclosure is hereby incorporated herein by reference. The at least partially crosslinked photosensitive polymeric microparticles may comprise an effective amount of photosensitive materials chosen from fluorescent materials, phosphorescent materials or mixtures thereof.

Examples of security elements include articles having an effective amount of the at least partially crosslinked photosensitive polymeric microparticles of the present invention that are incorporated into and/or connected to at least a portion of at least one surface of the article. The effective amount of photosensitive polymeric microparticles is an amount of such microparticles that enables authentication of the article. The effective amount of photosensitive microparticles can be localized in an authentication mark. Examples of such security elements include: access cards and passes, e.g., tickets, badges, identification or membership cards, debit cards etc.; negotiable instruments and non-negotiable instruments, e.g., drafts, checks, bonds, notes, certificates of deposit, stock certificates, etc.; government documents, e.g., currency, licenses, identification cards, benefit cards, visas, passports, official certificates, deeds etc.; consumer goods, e.g., software, compact discs ("CDs"), digital-video discs ("DVDs"), appliances, consumer electronics, tattoo ink, sporting goods, cars, etc.; credit cards; or merchandise tags, labels and packaging.

Although not limiting herein, the security element can be connected to at least a portion of a substrate chosen from a transparent substrate and a reflective substrate. Alternatively, where a reflective substrate is required, if the substrate is not reflective or sufficiently reflective for the intended application, a reflective material can be first applied to at least a portion of the substrate before the authentication mark is applied thereto. For example, an at least partially reflective aluminum coating can be applied to the at least a portion of the substrate prior to forming the security element thereon. Still further, a security element(s) can be connected to at least a portion of a substrate chosen from untinted substrates, tinted substrates, photochromic substrates, tinted-photochromic substrates, an at least partially linearly polarizing, an at least partially circularly polarizing substrates, and an at least partially elliptically polarizing substrates. The security elements may be at least partially linearly polarizing security elements.

Furthermore, the security element can further comprise one or more other coatings or sheets to form a multi-layer reflective security element with viewing angle dependent characteristics as described in U.S. Pat. No. 6,641,874 at column 1, line 6 to column 13, line 28, which is hereby incorporated herein by reference.

As used herein the term "at least partially linearly polarizing" with reference to coatings or substrates refers to coatings or substrates that are adapted to linearly polarize radiation (e.g., confine from some to all of the vibrations of the electric field vector of light waves to one direction). As used herein the term "at least partially circularly polarizing" with reference to coatings or substrates refers to coatings or substrates that are adapted to circularly polarize from some to all of the radiation. As used herein the term "at least partially elliptically polarizing" with reference to coatings or substrates refers to coatings or substrates that are adapted to elliptically polarize from some to all of the radiation. As used herein, the term "photochromic" when used in reference to coatings or substrates, refers to coating or substrate having an absorption spectrum for visible radiation that varies in response to at least actinic radiation. Further, as used herein with reference to substrates, the term "tinted-photochromic" means substrates containing a coloring agent as well as a photochromic material, and having an absorption spectrum for visible, ultraviolet and/or infrared radiation that varies in response to at least actinic radiation. Thus for example, the tinted-photochromic substrate can have a first color characteristic of the coloring agent and a second color characteristic of the combination of the coloring agent and the photochromic material when exposed to actinic radiation.

Methods of applying film-forming compositions of the present invention include those methods known in the art for applying coatings, such as spin coating, spray coating, spray and spin coating, curtain coating, flow coating, dip coating, injection molding, casting, roll coating, wire coating, and overmolding. According to certain embodiments, an at least partial coating comprising the photosensitive polymeric microparticles is applied to a mold and the substrate is formed on top of the coating or a preformed substrate is placed on top of the coating, e.g., by overmolding, and the coating is at least partially cured. In this example, the coating can be applied as a liquid or powder coating comprising the photosensitive polymeric microparticles. Photochromic articles including a polymeric sheet described hereinafter can also be prepared using the overmolding process.

The coated substrate may further comprise additional coating layers such as a primer coating, an abrasion resistant coating, an antireflective coating, a transitional coating interposed between the photosensitive coating and the abrasion resistant coating; an at least partially polarizing polymeric film or coating and combinations thereof.

As noted above, in some cases, a primer coating is applied to the substrate surface prior to application of the curable film-forming composition. The primer coating is interposed between the substrate and the curable film-forming composition, and serves as a barrier coating to prevent interaction of the polymeric coating components with the substrate and vice versa, and/or as an adhesive layer to promote adhesion of the curable film-forming composition to the substrate surface. The primer may be applied to the substrate by any known method, e.g., spray, spin, spread, curtain, roll or dip coating; and may be applied to a cleaned and untreated or cleaned and treated, e.g., chemically treated or plasma treated, surface of the substrate. Primer coatings are well known to those skilled in the art. Selection of an appropriate primer coating will depend on the substrate used, i.e., the primer coating must be chemically and physically compatible with the surface of the substrate and the curable film-forming composition, while providing the functional benefits desired for the primer coating, i.e., barrier and adhesive properties.

The primer coating may be one or several monomolecular layers thick, and can range from 0.1 to 10 microns, more usually from 0.1 to 2 or 3 microns. The thickness of the primer can vary between any combination of the aforementioned values, inclusive of the recited values. One contemplated example of a suitable primer coating comprises an organofunctional silane, such as methacryloxypropyl trimethoxysilane, a catalyst of a material that generates acid on exposure to actinic radiation, e.g., onium salts, and an organic solvent, such as diglyme or isopropyl alcohol, as described in U.S. Pat. No. 6,150,430, which disclosure is incorporated herein by reference.

A further example of a primer coating is described in U.S. Pat. No. 6,025,026, which describes a composition that is substantially free of organosiloxanes and which comprises organic anhydrides having at least one ethylenic linkage and an isocyanate-containing material. Such disclosure is incorporated also herein by reference. After application of the primer, the substrate may be rinsed with an alcohol such as 2-propanol and then water, and dried for up to half an hour at 60° C. to 80° C.

The aforementioned coatings can be connected to at least a portion of the same surface of a substrate in the following order from the surface: primer, photosensitive, transitional, abrasion resistant, polarizing film or coating, antireflective, and abrasion resistant; or primer, photosensitive, transitional, abrasion resistant, and antireflective; or photosensitive, transitional, and polarizing; or primer, photosensitive, and polarizing; or primer, photosensitive, and antireflective. Numerous different combinations of the aforementioned coatings are possible as known by those skilled in the art. All of the aforementioned coatings can be applied to one or more surfaces of a substrate, e.g., both surfaces of an optical substrate. The photosensitive coating is typically applied to one surface. The substrate can be any type of materials described herein as a substrate, such as an optical element; for example, an ophthalmic element.

Examples of primer coatings that can be used include coatings comprising coupling agents, at least partial hydrolysates of coupling agents, and mixtures thereof. As used herein "coupling agent" means a material having at least one group capable of reacting, binding and/or associating with a group on at least one surface. A coupling agent can serve as a molecular bridge at the interface of at least two surfaces that can be similar or dissimilar surfaces. Coupling agents can be monomers, pre-polymers and/or polymers. Such materials include organo-metallics such as silanes, titanates, zirconates, aluminates, zirconium aluminates, hydrolysates thereof and mixtures thereof. As used herein the phrase "at least partial hydrolysates of coupling agents" means that at least some to all of the hydrolyzable groups on the coupling agent are hydrolyzed. Other examples of primer coatings that are suitable for use include those primer coatings described U.S. Pat. No. 6,025,026 at column 3, line 3 to column 11, line 40 and U.S. Pat. No. 6,150,430 at column 2, line 39 to column 7, line 58, which disclosures are hereby incorporated herein by reference.

As used herein, the term "transitional coating" means a coating that aids in creating a gradient in properties between two coatings. For example, a transitional coating can aid in creating a gradient in hardness between a relatively hard coating and a relatively soft coating. Examples of transitional coatings include radiation-cured acrylate-based thin films as described in U.S. Pat. No. 7,452,611, which coating disclosure is hereby incorporated herein by reference.

Examples of at least partially abrasion resistant and other protective coatings include abrasion-resistant coatings comprising organosilanes, organosiloxanes, abrasion-resistant coatings based on inorganic materials such as silica, titania and/or zirconia, organic abrasion-resistant coatings of the type that are ultraviolet light curable, oxygen barrier-coatings that improve fatigue resistance of the photosensitive material, UV-shielding coatings, and combinations thereof.

The phrase "an at least partially abrasion resistant coating or sheet" refers to a coating or an at least partial sheet of a protective polymeric material that demonstrates a resistance to abrasion that is greater than a standard reference material, e.g., a polymer made of CR-39® monomer available from PPG Industries, Inc, as tested in a method comparable to ASTM F-735 Standard Test Method for Abrasion Resistance of Transparent Plastics and Coatings Using the Oscillating Sand Method.

The phrase "an at least partially antireflective coating" refers to a coating that at least partially improves the antireflective nature of the substrate to which it is applied by reducing the amount of glare reflected by the surface of the substrate and for transparent substrates by increasing the percent transmittance as compared to an uncoated substrate. Examples of antireflective coatings include a monolayer or multilayer of metal oxides, metal fluorides, or other such materials, which can be deposited onto the articles of the present invention through vacuum evaporation, sputtering, or some other method.

Examples of at least partially linearly polarizing coatings include coatings comprising conventional dichroic compounds such as those discussed previously.

The present invention is more particularly described in the following examples, which are intended as illustrative only, since numerous modifications and variations therein will be apparent to those skilled in the art.

In Section I, the preparation of Examples I-3 of modified non-aqueous dispersions of photochromic microparticles and Comparative Examples 1-3 of non-aqueous dispersions of photochromic microparticles is described. In Section II, coating compositions that incorporated the photochromic microparticles of Section I are described as well as the preparation of coated lenses and physical testing performed on the coated lenses. In Section III, photochromic performance testing done on selected coated lenses was described.

All water used in the examples and comparative examples was deionized water. Gel permeation chromatography (GPC) was performed using polystyrene standards with molecular weights being reported in number average molecular weight (Mn) in grams/mole, weight average molecular weight (Mw) in grams/mole, and polydispersity index (PDI). Sonication was performed using a Fischer Scientific Model FS30D sonicator at an output frequency of 42 KHz for the time period indicated. Percent solids test was performed by adding a known amount of the material to an aluminum pan, adding acetone to evenly distribute it over the pan, heating in an oven at 120° C. for 1 hour (unless specified otherwise), determining the mass differential from initial weight and calculating the percentage.

Section I

Preparation of Examples and Comparative Examples

Example 1

Step 1—Preparation of Hydrophilic Urethane Prepolymer

The following materials were added in the order described to a four neck round bottom flask equipped with an electronic temperature probe, mechanical stirrer, condenser, and a heating mantle.

| Charge | Material | Weight in grams |
| --- | --- | --- |
| A | N-methyl pyrrolidinone | 120 |
|  | dimethylolpropionic acid | 100.6 |
|  | triphenyl phospite | 0.9 |
|  | dibutyltin dilaurate | 0.9 |
|  | butylated hydroxytoluene | 0.9 |
| B | 2-(dicaprolactone)ethyl acrylate | 258.3 |
| C | methylene bis(4-cyclohexylisocyanate) | 393.0 |
| D | diethanolamine | 78.9 |
|  | toluene | 454.9 |

Charge A was stirred in the flask at a temperature of 100° C. until all solids were dissolved. Charge B was added and the temperature of the mixture was adjusted to 80° C. Charge C was added over a 15 minute period and the resulting mixture was held at 80° C. for 3 hours. Charge D was added and the mixture was cooled to room temperature. The final product was an extremely viscous clear yellow solution with an acid value of 31.0 and a percent solids content of 60%. The acid value was measured by potentiometric titration with KOH.

Step 2—Preparation of Photochromic Hydrophobic Urethane Methacrylate 3,3-Di(4-methoxyphenyl)-6,11,13-trimethyl-13-(2-(2-(2-hydroxyethoxy)-ethoxy)ethoxy)-3H,13H-indeno[2',3':3,4]naphtho[1,2-b]pyran (53.6 g, 0.08 mole) Photochromic A, trimethylene carbonate (146 g, 1.43 moles), anhydrous chloroform (400 mL) and aluminum isopropoxide (3.3 g, 0.016 mole) were added to a 1 liter 1 neck flask with a magnetic stir bar, purged with dry nitrogen, capped with rubber septum, and then allowed to stir at room temperature for 24 hrs. The resulting dark purple organic solution was washed by adding a solution of conc. HCl (16 g) in $H_2O$ (400 g) and stirring vigorously. Upon separation and removal of the aqueous phase, the organic layer was then washed with 10 weight % aqueous sodium bicarbonate solution (400 mL). The recovered organic layer was dried with magnesium sulfate, filtered, and poured into a 1 liter rotary evaporation flask. The molecular weight distribution by GPC was determined to be an Mn of 3,090, a Mw of 3960 and PDI of 1.28. After rotary evaporation for 1 hour at 90° C., the dark purple oil was diluted with anhydrous toluene (200 g), and to this solution was added 4 drops of dibutyltindilaurate and isocyanatoethylmethacrylate (12.6 g, 0.081 mole). The resulting reaction mixture was heated to 76° C., purged with dry nitrogen, capped with a rubber septum, stirred for 3 hrs at 76° C., followed by stirring overnight at room temperature.

Step 3—Preparation of an Aqueous Dispersion of Photochromic Microparticles

The following materials were added in the order described as follows.

| Charge | Material | Weight in grams |
| --- | --- | --- |
| A | Water | 124.0 |
|  | dimethylethanolamine | 0.72 |
|  | butyl acrylate | 16.44 |
|  | ethylene glycol dimethacrylate | 2.40 |
|  | Product of Step 1 | 19.20 |
| B | Product of Step 2 | 18.91 |
| C | Water | 10.0 |
|  | ferrous ammonium sulfate (1 wt. % in $H_2O$) | 0.16 |
|  | t-butyl hydroperoxide | 0.08 |
| D | Water | 10.0 |
|  | sodium metabisulfite | 0.10 |

A pre-emulsion was prepared by first shaking a container of Charge A and then stirring it in a glass beaker. The pre-emulsion was recycled through a Microfluidizer® M110T at 8000 psi while Charge B was added. The Microfluidizer® M110T is available from the Microfluidics™ division of MFIC Corporation, Newton, Mass. The recirculation was continued until the emulsion temperature reached 60° C., then cooling water and ice was added to the external bath to cool the recirculating emulsion to less than 30° C. Charge C was added rapidly as a mixture and then Charge D was added as a mixture drop-wise over a period of 10 minutes. Finally, the milky purple dispersion was pumped into a 1 liter rotary evaporation flask.

Step 4—Preparation of the Non-Aqueous Dispersion (NAD) of Photochromic Microparticles Propylene glycol (160 g) was added to a 1 liter rotary evaporation flask containing 2 batches of the aqueous emulsions of the product of Step 3 (17.3 wt. % solids). The mixture was rotary evaporated at 45° C. and <10 mm Hg pressure until a constant weight was obtained in about 4 hours. The resulting percent solids content was 32%.

Step 5—Conversion of Acidic Surface Functionality to Diol

The product of Step 4 (110 g) and a 50 weight % solution of 2,3-epoxy-1-propanol in toluene (1.6 g) was added to a 3 neck, 2 liter flask outfitted with a thermocouple with nitrogen inlet, condenser and stirrer. With stirring and slight positive nitrogen flow, the mixture was heated to 70° C. and stirred for 3.5 hours, at which time the acid value had dropped from 5.4 to 1.1. The solution was then rotary evaporated for 30 minutes at 30 mm Hg and 55° C. and then 30 minutes at 2 mm Hg and 55° C. The final solids content was determined to be 29.4% using the aforedescribed procedure except after 1 hour of heating in an oven at 110° C.

Example 2

Step 1 Preparation of the Hydrophilic Urethane Prepolymer

The following materials were added in the order described to a suitably equipped reaction flask.

| Charge | Material | Weight in grams |
|---|---|---|
| A | 2,2-dimethylolpropionic acid | 6.7 |
|  | butylated hydroxytoluene | 0.1 |
|  | triphenyl phospite | 0.1 |
|  | dibutyltin dilaurate | 0.1 |
|  | N-methyl pyrrolidinone | 6.7 |
| B | SR495B[1] | 34.4 |
| C | DESMODUR® N3600[2] | 54.78 |
|  | Toluene | 50.3 |
| D | diethanolamine | 10.5 |
|  | Toluene | 14.19 |

[1]Reported to be a caprolactone acrylate available from Sartomer Company, Inc.
[2]Reported to be a polyfunctional aliphatic polyisocyanate resin available from Bayer Materials Science LLC.

Charge A was stirred in the flask at a temperature of 55° C. and became a hazy solution. Charge B was added and the mixture was maintained at 55° C. Charge C was added over a 15 minute period and the resulting mixture was held at 55° C. for 1 hour followed by 3 hours at 60° C. The heating bath was removed and Charge D was added. The final product was a clear viscous solution.

Step 2—Preparation of a Hydrophobic Urethane Prepolymer

The following materials were added in the order described to a suitably equipped reaction flask.

| Charge | Material | Weight in grams |
|---|---|---|
| A | Toluene | 112 |
| B | DDI® 1410 diisocyanate[3] | 65.45 |
|  | dibutylated hydroxytoluene | 0.1573 |
|  | dibutyltin dilaurate | 0.1577 |
| C | Photochromic A[4] | 30.0 |
| D | Toluene | 10.7 |
| E | SR495B[1] | 64.51 |

[3]Reported to be an aliphatic diisocyanate available from Cognis.
[4]Photochromic A is 3,3-di(4-methoxyphenyl)-6,11,13-trimethyl-13-(2-(2-(2-hydroxyethoxy)ethoxy)ethoxy)-3H,13H-indeno[2',3':3,4]naphtho[1,2-b]pyran.

Charge A was added to a suitably equipped reaction flask. Charge B was added and the mixture was stirred and heated to 90° C. After reaching 90° C., Charge C was added via an addition funned and Charge D was used to rinse the addition funnel. Upon completion of the addition, the resulting mixture was maintained at 90° C. for 1.5 hours. The mixture was cooled to 80° C. Charge E was added with air bubbling into the mixture via a needle. The resulting mixture was heated to 80° C. for an hour. After cooling, the final product was transferred to a glass jar.

Step 3—Preparation of Non-Aqueous Dispersion

The following materials were added in the order described as follows.

| Charge | Material | Weight in grams |
|---|---|---|
| A | Product of Step 1 | 18.8 |
|  | Butylacrylate | 14.8 |
|  | dimethylethanolamine | 0.33 |
|  | Water | 118.0 |
|  | Product of Step 2 | 18.4 |
|  | Toluene | 8.8 |
| B | water | 12.0 |
|  | ferrous ammonium sulfate (1 wt. percent aqueous solution) | 0.16 |
|  | t-butylhydroperoxide | 0.08 |
| C | Water | 20 |
|  | sodium metabisulfite | 0.10 |
| D | propylene glycol | 80.0 |

A pre-emulsion was prepared by stirring Charge A in a glass beaker. This pre-emulsion was sonicated at room temperature for 10 minutes. The pre-emulsion was cycled three times through a Microfluidizer® M-110P at 12,500 psi. The Microfluidizer® M-110P is available from the Microfluidics™ division of MFIC Corporation, Newton, Mass. The resulting temperature of the pre-emulsion was about 20-27° C. Charge B was added followed by the addition of Charge C over 10 minutes. The resulting milky purple dispersion was transferred to a rotary evaporation flask and Charge D was added. The resulting dispersion was evaporated until water was no longer collected and a constant weight was obtained. The solid percent was determined to be 26%. A sample of the non-aqueous dispersion (20 g) was saved for comparison.

Step 4—Chemical Functionalization of the Non-Aqueous Dispersion

Part A—Preparation of Atom Transfer Radical Polymerization (ATRP) Initiator

A solution of glycidol (10 g, 0.135 mol), pyridine (11 g, 0.139 mol), and chloroform (15 mL) was added to a suitable container and chilled to 0° C. 2-Bromo-2-methylpropanoyl bromide (28 g, 0.13 mol) in chloroform (30 mL) was added dropwise over 15 minutes under a nitrogen atmosphere. The reaction solution was stirred at room temperature for 14 hours. The solution was washed three times with 5 weight % HCl in water. The organic phase was separated, dried over magnesium sulfate, and chloroform was removed by evaporation. The recovered product was a slightly yellow and clear oil (26.1 g). An NMR spectrum showed the product to have a structure consistent with oxiran-2-ylmethyl 2-bromo-2-methylpropanoate.

Part B—Surface Functionalization of the Non-Aqueous Dispersion

A flask containing the product of Step 3 (49 g) was diluted with 25 g propane-dial and placed under reduced pressure for 3 hours at 55° C. to further remove water. Oxiran-2-ylmethyl 2-bromo-2-methylpropanoate (0.406 g) from Part A was added to the flask. The resulting reaction was stirred at 70° C. for 2 hours under nitrogen in an oil bath, followed by 50° C. for 1 day.

Part C—Surface Polymerization of the Non-Aqueous Dispersion

The product of Part B (27.0 g) was diluted with methoxypropanol (110 mL) and isopropanol (65 mL) and mixed with stirring. CuCl$_2$ (0.0025 mg), 2,2-dipyridyl (0.03 g), and n-(butoxymethyl)methacrylamide (3.0 g) were added and degassed with bubbling nitrogen for 30 minutes. Ascorbic acid (0.041 g) was added and the solution was stirred overnight at room temperature under nitrogen. The sample was exposed to oxygen by bubbling air and alumina (20 g) was added. The sample was filtered though an alumina plug and placed under reduced pressure to remove the isopropanol and methoxy-propanol. Polymerization was confirmed by monitoring the GPC of the sample. Percent solids were 36.6%.

Example 3

Step 1—Preparation of the Hydrophilic Urethane Prepolymer

The following materials were added in the order described to a suitably equipped reaction flask such as a fourneck round bottom flask equipped with an electronic temperature probe, mechanical stirrer, condenser, and a heating mantle

| Charge | Material | Weight in grams |
|---|---|---|
| A | 2,2-dimethylolpropionic acid | 100.6 |
|  | butylated hydroxytoluene | 0.9 |
|  | triphenyl phospite | 0.9 |
|  | dibutyltin dilaurate | 0.9 |
|  | N-methyl pyrrolidinone | 120.0 |
| B | SR495B[1] | 258.3 |
| C | dicyclohexylmethanediisocyanate | 393.0 |
| D | Toluene | 376.0 |
|  | diethanolamine | 78.9 |
|  | Toluene | 78.9 |

Charge A was stirred in the flask at a temperature of 100° C. until all solids were dissolved. Charge B was added and the mixture was reheated to 80° C. Charge C was added over a 15 minute period and the resulting mixture was held at 80° C. for 3 hours and cooled to below 50° C. Charge D was added and the resulting mixture was stirred for 30 minutes as cooled to room temperature. The final product was an extremely viscous clear yellow solution.

Step 2—Preparation of Non-Aqueous Dispersion

The following materials were added in the order described as follows.

| Charge | Material | Weight in grams |
|---|---|---|
| A | Product of Step 1 | 28.2 |
|  | Butylacrylate | 22.2 |
|  | dimethylethanolamine | 0.95 |
|  | Water | 188.0 |
|  | Product of Step 2 of Example 2 | 27.6 |
|  | Toluene | 13.2 |
| B | water | 12.0 |
|  | ferrous ammonium sulfate (1 wt. percent aqueous solution) | 0.24 |
|  | t-butylhydroperoxide | 0.12 |
| C | Water | 20 |
|  | sodium metabisulfite | 0.15 |
| D | propylene glycol | 140.0 |

A pre-emulsion was prepared by stirring Charge A in a glass beaker. This pre-emulsion was sonicated at room temperature for 10 minutes. The pre-emulsion was cycled three times through a Microfluidizer® M-110P at 12,500 psi. The Microfluidizer® M-110P is available from the Microfluidics™ division of MFIC Corporation, Newton, Mass. The resulting temperature of the pre-emulsion was about 20-27° C. Charge B was added followed by the addition of Charge C over 10 minutes. The resulting milky purple dispersion was transferred to a rotary evaporation flask and Charge D was added. The resulting dispersion was evaporated until water was no longer collected and a constant weight was obtained, The percent solids was determined to be 27%.

Step 3—Chemical Functionalization of the Non-Aqueous Dispersion

Part A—Surface Functionalization of the Non-Aqueous Dispersion

To a flask containing the product of Step 2 (80 g) was added oxiran-2-ylmethyl 2-bromo-2-methylpropanoate (0.676 g) from Part A of Example 2 and dimethylethanolamine (0.150 g). The reaction mixture was stirred at 70° C. for 3 hours under nitrogen in an oil bath, followed by 50° C. for 1 day.

Part B—Surface Polymerization of the Non-Aqueous Dispersion

The product of Part B (15.0 g) was diluted with methoxypropanol (36 mL) and isopropanol (24 mL) and mixed with stirring. CuCl$_2$ (0.0005 mg), 2,2-dipyridyl (0.014 g), and n-(butoxymethyl)methacrylamide (1.2 g) were added and degassed with bubbling nitrogen for 30 minutes. Ascorbic acid (0.015 g) was added and the solution was stirred overnight at room temperature under nitrogen. The sample was exposed to oxygen by bubbling air and alumina (20 g) was added. The sample was filtered though an alumina plug and placed under reduced pressure to remove the isopropanol and methoxy-propanol. Polymerization was confirmed by monitoring the GPC of the sample.

Comparative Example 1 (CE-1)

The product of Step 4 of Example 1 was used as CE-1.

Comparative Example 2 (CE-2)

The product of Step 3 of Example 2 was used as CE-2.

Comparative Example 3 (CE-3)

The product of Step 2 of Example 3 was used as CE-3.

Section II

Preparation of Coating Compositions, Coated Lenses and Physical Testing Thereof Part A—Preparation of Solgel Coating Compositions of Example 1 and CE-1

Hi-Gard®1080 coating solution (40.0 g), a commercially available solgel hardcoat coating solution from PPG Industries, Inc., was added to two suitable containers. Example 1 (58.5 g) was added to one container and CE-1 (58.5 g) was added to the other. After the additions, both containers were shaken for a minimum of 5 seconds. To each container was added TINUVIN® 292 light stabilizer (1.5 g), a commercially available hindered amine light stabilizer from CIBA Specialty Chemicals. After the additions, both containers were shaken for a minimum of 5 seconds. The resulting solutions were left quiescent for 30 to 60 minutes to drive off air bubbles that may have formed.

Part B—Application of Coatings from Part A

PDQ® coated Gentex® polycarbonate plano lenses having a diameter of 76 millimeters were treated with oxygen plasma at a flow rate of 100 milliliters (mL) per minute of oxygen at 120 watts of power for three minute. Each of the lenses was coated two times with photochromic coating in order to achieve appropriate film build. Both applications were with the solutions containing Examples 1 and CE-1 via a spin coating process. Each application used about 1-2 mL of solution. For the 1$^{st}$ application, the lens was rotated at 644 rpm for 8 seconds. The coated lenses were subsequently flash dried at 80° C. for 10 minutes. A thinner second coat was then applied by dispensing and rotation at 1670 rpm for 8 seconds. Another flash bake of 80° C. for 10 minutes was performed. The lens was then topcoated with Hi-Gard®1080 coating solution by dispensing 1-2 mL of solution and spinning at 1067 rpm for 8 seconds. Afterwards, the flash dried coated lenses were cured at 120° C. for 3 hours. The resulting lenses each had a coating of the solutions from Part A having a thickness of about 22 microns.

Part C—Stability Testing of Coating Solution of Part A

The coating solutions of Part A were stored at room temperature and evaluated for appearance. Immediately after preparation of the coatings, both were found to be of an equal viscosity and non-gelled, i.e., visibly free of small particles of solid in the liquid. After 4 days, the coating solution containing CE-1 became more viscous while the coating solution of Example 1 was unchanged. After 5 days, the coating solution containing CE-1 became gelled while the coating solution of Example 1 was unchanged. After 8 days, the coating solution containing CE-1 remained gelled while the coating solution of Example 1 was unchanged.

Part D—Preparation of Melamine Coatings with Examples 2-3 and CE-2 and CE-3

The following materials listed in gram quantities were added in the order listed to a one fluid ounce sized glass jar with sufficient mixing after each addition to homogeneously disperse the material. After completing the addition, each mixture was rolled for a minimum of 4 hours at the highest dial setting on a Wheaton Bench Top Roller at room temperature.

| Materials | Coating of Ex. 2 | Coating of CE-2 | Coating of Ex. 3 | Coating of CE-3 |
|---|---|---|---|---|
| Ex. 2 | 7.0137 | — | — | — |
| CE-2 | — | 7.3141 | — | — |
| Ex. 3 | — | — | 7.9273 | — |
| CE-3 | — | — | — | 7.7530 |
| SIU9055.0[6] | 0.3549 | 0.2831 | 0.2851 | 0.2900 |
| CYMEL ® 327[7] resin | 2.5734 | 2.1023 | 2.0733 | 2.0951 |
| TINUVIN ® 292[8] | 0.0547 | 0.0586 | 0.0485 | 0.0526 |
| 1-methyl-2-pyrrolidinone | — | 0.3188 | 0.3155 | 0.3024 |

[6]Reported to be a ureidopropyltriethoxysilane available from Gelest.
[7]Reported to be a melamine formaldehyde available from Cytec.
[8]Reported to be a hindered amine light stabilizer available from Ciba Specialty Chemicals.

Part E—Application of Coatings from Part D

PDQ® coated Gentex® polycarbonate plano lenses having a diameter of 76 millimeters were used as supplied. The lenses were treated with oxygen plasma at a flow rate of 100 milliliters (mL) per minute of oxygen at 100 watts of power for one minute. The lenses were coated with the solutions of Examples 2-3 and CE-2 & CE-3 via a spin coating process. About 1-2 mL of the solution of each example was dispensed onto the lens and the lens rotated at 765 rpm for 8 seconds. The coated lenses were cured in a forced air oven via the following cure cycle: 80° C. for 5 minutes and 140° C. for 1 hour and cooled to room temperature. The coated lenses were treated again with oxygen plasma as described above and coated with HI-GARD®1080 coating solution, a commercially available solgel hardcoat producing coating solution from PPG Industries, Inc., via a spin coating process. About 1-2 mL of the HI-GARD 1080 was dispensed onto the lens and the lens rotated at 1067 rpm for 8 seconds. Subsequently, the lenses coated with HI-GARD®1080 coating solution were cured at 120° C. for 3 hours.

Part F—Physical Testing

The coated lenses prepared in Part E were tested for Haze. The Haze Test was conducted by determining the initial percent haze of the lenses prepared in Part E and the secondary percent haze after the lenses were submerged in deionized boiling water for 30 minutes. After being submerged in boiling water, the lenses were wiped dry and allowed to cool to room temperature before testing. Haze was measured using a Hunter Lab UltraScan XE instrument. A lower amount of percent haze indicated by a lower number is a desirable result.

| Example # | Initial % Haze | Secondary % Haze |
|---|---|---|
| 2 | 0.38 | 0.52 |
| CE-2 | 1.06 | 30.18 |
| 3 | 0.34 | 1.53 |
| CE-3 | 0.48 | 9.29 |

Section III

Photochromic Performance Testing

The photochromic performance of the coated lenses listed in the table below was determined as follows. The coated lenses prepared in Section II were tested for photochromic response on the Bench for Measuring Photochromics ("BMP") optical bench made by Essilor, Ltd. France. The optical bench was maintained at a constant temperature of 23° C. (73.4° F.) during testing.

Prior to testing on the optical bench, each of the coated lenses were exposed to 365-nanometer ultraviolet light for about 10 minutes at a distance of about 14 centimeters to activate the photochromic materials. The UVA (315 to 380 nm) irradiance at the lens was measured with a Licor Model Li-1800 spectroradiometer and found to be 22.2 watts per square meter. The lens was then placed under a 500 watt, high intensity halogen lamp for about 10 minutes at a distance of about 36 centimeters to bleach (inactivate) the photochromic materials. The illuminance at the lens was measured with the Licor spectroradiometer and found to be 21.4 Klux. The lenses were then kept in a dark environment at room temperature (from 21° C. to 24° C., or 70° F. to 75° F.) for at least 1 hour prior to testing on an optical bench. Prior to optical bench measurement, the lenses were measured for ultraviolet absorbance at 390 and 405 nm.

The BMP optical bench was fitted with two 150-watt ORIEL® Model #66057 Xenon arc lamps at right angles to each other. The light path from Lamp 1 was directed through a 3 mm SCHOTT® KG-2 band-pass filter and appropriate neutral density filters that contributed to the required UV and partial visible light irradiance level. The light path from Lamp 2 was directed through a 3 mm SCHOTT® KG-2 band-pass filter, a SCHOTT® short band 400 nm cutoff filter and appropriate neutral density filters in order to provide supplemental visible light illuminance. A 5.1 cm×5.1 cm (2 inch×2 inch) 50% polka dot beam splitter, at 45° to each lamp is used to mix the two beams. The combination of neutral density filters and voltage control of the Xenon arc lamp were used to adjust the intensity of the irradiance. Proprietary software was used on the BMP to control timing, irradiance, air cell and sample temperature, shuttering, filter selection and response measurement. A ZEISS® spectrophotometer, Model MCS 501, with fiber optic cables for light delivery through the lens was used for response and color measurement. Response measurements were done for lenses containing Photochromic A at 565 to 570 nm.

The power output of the optical bench, i.e., the dosage of light that the lens was exposed to, was adjusted to 6.7 Watts per square meter ($W/m^2$) UVA, integrated from 315-380 nm and 50 Klux illuminance and integrated from 380-780 nm. Measurement of the power output was made using the optometer and software contained within the BMP.

Response measurements, in terms of a change in optical density ($\Delta OD$) from the unactivated or bleached state to the activated or colored state were determined by establishing the initial unactivated transmittance, opening the shutter from the Xenon lamp(s) and measuring the transmittance through activation at selected intervals of time. Change in optical density was determined according to the formula: $\Delta OD = \log_{10}(\% Tb/\% Ta)$, where % Tb is the percent transmittance in the bleached state, % Ta is the percent transmittance in the activated state.

The results of this testing are presented below, wherein the First Fade Half Life ("T1/2") values, which are the time intervals in seconds for the $\Delta OD$ of the activated form of the photochromic materials in the coatings to reach one half the fifteen-minute $\Delta OD$ at 23° C. (73.4° F.), after removal of the activating light source. The Second Fade Half Life ("2T1/2") value is the time interval in seconds for the $\Delta OD$ of the activated form of the photochromic material in the coating to reach one quarter the fifteen-minute $\Delta OD$ at 23° C. (73.4° F.), after removal of the activating light source. The Third Half Life ("3T1/2") value is the time interval in second for $\Delta OD$ of the activated form of the photochromic material in the coating to reach one-eighth the fifteen-minute $\Delta OD$ at 23° C. (73.4° F.), after removal of the activating light source.

| Lens coated with Example # | First Half-life of fade (sec) | Second Half-life of fade (sec) | Third Half-life of fade (sec) |
|---|---|---|---|
| 1 | 52 | 118 | 232 |
| CE-1 | 51 | 114 | 226 |
| 2 | 79 | 250 | 1813 |
| CE-2 | 42 | 100 | 267 |
| 3 | 41 | 94 | 214 |
| CE-3 | 39 | 87 | 177 |

The present invention has been described with reference to specific details of particular embodiments thereof. It is not intended that such details be regarded as limitations upon the scope of the invention except insofar as to the extent that they are included in the accompanying claims.

What is claimed is:

1. A method for producing a non-aqueous dispersion of photosensitive microparticles comprising:
   a) preparing an aqueous dispersion of a photosensitive material and a polymerizable component, wherein the polymerizable component comprises at least one hydrophilic functional group and at least one hydrophobic functional group;
   b) subjecting the dispersion of a) to conditions sufficient to form microparticles;
   c) at least partially polymerizing the polymerizable component;
   d) combining the dispersion with an organic continuous phase comprising an organic solvent;
   e) removing water from the dispersion such that the final water content of the non-aqueous dispersion is less than 30 percent by weight; wherein step e) is performed before or after step d); and
   f) reacting any acid functional groups in the microparticles with at least one reactive material.

2. The method of claim 1 wherein the reactive material has at least one epoxy functional group, at least one thiocarbonylthio functional group, at least one alkoxyamine functional group, and/or at least one halide functional group.

3. The method of claim 2 wherein the reactive material has at least one epoxy functional group and at least one hydroxyl functional group and comprises 2,3-epoxy-1-propanol (glycidol).

4. The method of claim 2 wherein the reactive material has at least one epoxy functional group and at least one halide functional group.

5. The method of claim 4 wherein the reactive material comprises a reaction product of (1) an epoxy functional compound with at least one active hydrogen group capable of reacting with an acid halide or alkyl ester and (2) an acid halide or alkyl ester functional compound having at least one halide functional group.

6. The method of claim 5 wherein the reactive material comprises a reaction product of (1) 2,3-epoxy-1-propanol (glycidol) and (2) 2-bromo-2-methylpropanoyl bromide.

7. The method of claim 1 wherein the organic solvent is a polar solvent comprising an alcohol, dial, glycol, ether, amide, nitrile, ester, ketone, and/or lactam.

8. The method of claim 1 wherein the hydrophilic functional group is provided by a substantially hydrophilic monomer and the hydrophobic functional group is provided by a substantially hydrophobic monomer.

9. The method of claim 8 wherein the substantially hydrophilic monomer is prepared from a triisocyanate and/or a polycarbonate functional diol prepared from the reaction of 1,6-hexanediol with phosgene or dimethyl carbonate.

10. The method of claim 1 wherein the polymerizable component further comprises at least one copolymerizable material that is different from the substantially hydrophilic monomer or the substantially hydrophobic monomer.

11. The method of claim 1 wherein step b) comprises subjecting the dispersion of a) to high shear stress conditions.

12. A method for producing a non-aqueous dispersion of photosensitive microparticles comprising:
   a) preparing an aqueous dispersion of a substantially hydrophilic prepolymer component;
   b) preparing an aqueous dispersion of a substantially hydrophobic prepolymer component, wherein the dispersion of a) and/or b) further comprises a photosensitive material;
   c) combining the dispersions of a) and b) to form a mixture and subjecting the mixture to conditions sufficient to form microparticles;
   d) polymerizing the prepolymer components in the mixture;
   e) combining the mixture with an organic continuous phase comprising an organic solvent;

f) removing water from the mixture such that the final water content less than 30 percent by weight; wherein f) is performed before or after e); and g) reacting any acid functional groups in the microparticles with a reactive material having at least one epoxy functional group.

13. The method of claim 12 wherein the reactive material has at least one epoxy functional group and at least one hydroxyl functional group, at least one thiocarbonylthio functional group, at least one alkoxyamine functional group, or at least one halide functional group.

14. The method of claim 13 wherein the reactive material has at least one epoxy functional group and at least one hydroxyl functional group and comprises 2,3-epoxy-1-propanol (glycidol).

15. The method of claim 13 wherein the reactive material has at least one epoxy functional group and at least one halide functional group.

16. The method of claim 15 wherein the reactive material comprises a reaction product of (1) an epoxy functional compound with at least one active hydrogen group capable of reacting with an acid halide or alkyl ester and (2) an acid halide or alkyl ester functional compound having at least one halide functional group.

17. The method of claim 16 wherein the reactive material comprises a reaction product of (1) 2,3-epoxy-1-propanol (glycidol) and (2) 2-bromo-2-methylpropanoyl bromide.

18. The method of claim 12 wherein the photosensitive material is an organic photochromic material having at least one functional group that is polymerizable with the prepolymer component of a) and/or b).

19. The method of claim 12 wherein c) comprises subjecting the mixture to high shear stress conditions.

20. The method of claim 12 wherein the photosensitive material is chosen from fluorescent materials, phosphorescent materials, nonlinear optical materials, photochromic materials or mixtures thereof.

21. The method of claim 12 wherein the organic solvent is a polar solvent comprising an alcohol, diol, glycol, ether, amide, nitrile, ester, ketone, and/or lactam.

22. The method of claim 12 wherein the polymerizable component further comprises at least one copolymerizable material that is different from the substantially hydrophilic monomer or the substantially hydrophobic monomer.

* * * * *